(12) United States Patent
Saito et al.

(10) Patent No.: US 6,885,814 B2
(45) Date of Patent: Apr. 26, 2005

(54) CARBON WIRE HEATING OBJECT SEALING HEATER AND FLUID HEATING APPARATUS USING THE SAME HEATER

(75) Inventors: Takanori Saito, Kanagawa (JP); Hiroshi Mori, Yamagata (JP); Akira Otsu, Toride (JP); Norihiko Saito, Yamagata (JP); Hiroyuki Honma, Yamagata (JP); Eiichi Toya, Yamagata (JP); Tomio Konn, Yamagata (JP); Tomohiro Nagata, Yamagata (JP); Ken Nakao, Sagamihara (JP); Kazutoshi Miura, Kanagawa (JP); Harunari Hasegawa, Kanagawa (JP); George Hoshi, Kanagawa (JP); Katsutoshi Ishi, Kanagawa (JP); Sunao Seko, Yamagata (JP)

(73) Assignees: Toshiba Ceramics Co., Ltd., Tokyo (JP); Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/395,395

(22) Filed: Mar. 25, 2003

(65) Prior Publication Data
US 2003/0180034 A1 Sep. 25, 2003

(30) Foreign Application Priority Data

| Mar. 25, 2002 | (JP) | ........................ | 2002-083078 |
| Mar. 29, 2002 | (JP) | ........................ | 2002-094543 |
| Mar. 29, 2002 | (JP) | ........................ | 2002-094544 |
| Mar. 29, 2002 | (JP) | ........................ | 2002-094546 |
| Nov. 8, 2002 | (JP) | ........................ | 2002-325380 |
| Dec. 5, 2002 | (JP) | ........................ | 2002-353842 |

(51) Int. Cl.$^7$ ................................................ H05B 3/00
(52) U.S. Cl. ........................................ 392/407; 219/553
(58) Field of Search .................................. 392/407, 480, 392/487, 485; 219/552, 553, 541, 544, 444.1

(56) References Cited

U.S. PATENT DOCUMENTS

| 5,753,891 | A | | 5/1998 | Iwata et al. | |
| 6,043,468 | A | * | 3/2000 | Toya et al. | ............... 219/544 |
| 6,057,532 | A | * | 5/2000 | Dexter et al. | ............... 219/553 |
| 6,204,488 | B1 | | 3/2001 | Toya et al. | |
| 6,407,371 | B1 | * | 6/2002 | Toya et al. | ............... 219/553 |
| 6,501,056 | B1 | * | 12/2002 | Hirohata et al. | ........... 219/553 |
| 6,516,143 | B1 | | 2/2003 | Toya et al. | |
| 6,591,062 | B1 | * | 7/2003 | Scherzer et al. | ........... 392/407 |
| 2001/0055478 | A1 | * | 12/2001 | Scherzer et al. | ........... 392/407 |
| 2002/0001460 | A1 | * | 1/2002 | Seko et al. | ............... 392/407 |
| 2002/0162835 | A1 | * | 11/2002 | Toya et al. | ............... 219/553 |
| 2003/0031471 | A1 | * | 2/2003 | Schneider et al. | ......... 392/407 |

FOREIGN PATENT DOCUMENTS

| DE | 4438870 | * | 5/1986 |
| JP | 2000-21890 A | | 1/2000 |
| JP | 2001-291575 | * | 10/2001 |

* cited by examiner

Primary Examiner—John A. Jeffery
(74) Attorney, Agent, or Firm—Foley & Lardner LLP

(57) ABSTRACT

A carbon wire heating element sealing heater is provided. Therein, a carbon wire heating element using carbon fibers is sealed in a quartz glass member, wherein absorption water quantity of the carbon wire heating element is $2 \times 10^{-3}$ g/cm$^3$ or less.

27 Claims, 19 Drawing Sheets

CARBON WIRE HEATING OBJECT SEALING HEATER AND FLUID HEATING APPARATUS USING THE SAME HEATER

BACKGROUND OF THE INVENTION

1. Field of the Invention

The present invention relates to a carbon wire heating object sealing heater and a fluid heating apparatus using the same heater and more particularly to a carbon wire heating object sealing heater having an excellent heating characteristic which allows it to be used preferably for semiconductor processing and a fluid heating apparatus using the same heater.

2. Description of the Related Art

Semiconductor manufacturing processing requires strict temperature control under a heat treatment environment for various kinds of heat treatment processes such as oxidation, diffusion and CVD processing. Further, heating means in the heat treatment process absolutely needs to be non-generation source of a substance which deteriorates semiconductor performance such as impure metal. For the reason, a heater in which the outside of its heating element composed of tungsten and the like is covered with quartz glass has been often used.

If the quartz glass for covering the heating element composed of tungsten and the like happens to be damaged when the heater is used, for example, in a semiconductor manufacturing process field, atmosphere, cleaning fluid, grind fluid and the like are contaminated with the metal, so that wafers are also further contaminated. Even if the quartz glass pipe is not damaged, there exists such a problem that the metallic contamination may be generated from the heating element through the quartz glass.

From viewpoints for preventing the metallic contamination with impure metal, the inventors have proposed a carbon wire heating element sealing heater which can be used as a semiconductor manufacturing heater, which is more advantageous than the metallic heating element (Japanese Patent Application Laid-Open No. 2000-21890).

This carbon wire (heating element) is manufactured by knitting plural bundles, each bundle being composed of ultra fine carbon fibers. Its heating capacity is smaller and its temperature rising/declining characteristic is more excellent than a conventional metallic heating element and its high-temperature durability is excellent under non-oxidizing atmosphere. Because this carbon wire is manufactured by knitting plural bundles each composed of fine carbon fibers, it has more excellent flexibility than a heating element composed of bare carbon material and such an advantage that it can be processed easily into various configuration or shape as a semiconductor manufacturing heater.

In recent years, particularly in semiconductor manufacturing industrial filed, the diameter of the wafer has been increased more and more for large capacity integration of the semiconductor circuit and improvement of yield rate for reduction of cost has been demanded more strongly. To meet such demands, more strict temperature control than before has been demanded. For the reason, a heater with less heating unevenness so as to heat a treatment furnace and the like to a desired condition has been demanded.

Although this carbon wire heating element sealing heater is very excellent in views of prevention of impure metal pollution as described above, generation of black spots on an inner face of an element pipe (quartz glass pipe) in which the carbon wire heating element was sealed was noticed when that heater was used.

Particularly in a carbon wire heating element sealing heater having a U shaped side view, having a straight heating portion and provided with terminal portions on both ends of the same straight portion through each bent portion, generation of these black spots was noticed.

Generation of the black spots on the inner face of the element pipe (quartz glass pipe) in which the carbon wire heating element is sealed is not favorable because it blocks and shields from radiation heat thereby causing unevenness in heating.

Accordingly, the inventors of the present invention have noticed that generation of the black spots occurs under influences of absorption water quantity of the carbon wire in which the element pipe (quartz glass pipe) is sealed in and the inside diameter of the element pipe (quartz glass pipe) as a result of accumulated researches on the cause thereof and then, reached the present invention.

As shown in FIGS. 27A and 27B, the terminal portion of the aforementioned carbon wire heating element sealing heater comprises a glass pipe 421, wire carbon materials 423 accommodated within this glass pipe 421 in a compressed state, a carbon wire heating element 422 accommodated in the glass pipe 421 and nipped by the wire carbon materials 423, and a power supply connecting wire 424 accommodated within the glass pipe 421 and nipped by the wire carbon materials 423. A quartz glass member 425 constituting a heater main body is connected to an opening end portion 421a of the glass pipe 421 and the carbon wire heating element 422 is introduced out of the opening end portion 421a. This opening end portion 421a is slightly constricted in order to prevent internally loaded substance such as the carbon wire heating element 422 and the wire carbon material 423 from jumping out. On the other hand, the other opening end portion (not shown) of the glass pipe 421 is closed with other glass member with the connecting wire 424 introduced out thereof.

Such a structure connects the carbon wire heating element 422 with the power supply connecting wire 24 electrically through the wire carbon materials 423.

Conventionally, when the wire carbon materials 423 were accommodated in the terminal portion (glass pipe 421) in a compressed state, the wire carbon materials 423 were loaded in the glass pipe 421 by batch. For the reason, it sometimes comes that as shown in FIG. 27B, an end portion of the carbon wire heating element 422 is deflected toward a wall side of the glass pipe 421. As a result, as shown in FIG. 27A, a periphery of an opening end portion 421a may make contact with the carbon wire heating element 422. If the carbon wire heating element 422 and the glass pipe 421 make a direct contact with each other (because pressed), reaction between carbon (C) and quartz ($SiO_2$) progresses at a contact point, so that breaking of wire is likely to occur at that point.

As regards the shape of the heater terminal portion, an L-shaped terminal portion as shown in FIG. 28 is also used. In this terminal portion also, the wire carbon materials 423 are loaded on a side 426a of the glass pipe 426 by batch so as to fix the carbon wire heating element 422 and then, the carbon wire heating element 422 is introduced to the other side 426b of the glass pipe 426. In the meantime, the heater main body is formed ahead of the other side 426b.

If the carbon wire heating element 422 is bent at this terminal portion, the wire carbon materials 423 are swollen inside the bent portion of the L-shaped glass pipe 426 as shown in FIG. 28 so that the carbon wire heating element 422 is pressed against the inner wall of the glass pipe 426. As a result, the carbon wire heating element 422 makes a contact with the wall face of the glass pipe 426, so that reaction between carbon (C) and quartz ($SiO_2$) progresses at this contact point, there by likely generating breaking of wire, which is a technical problem to be solved.

As described above, more strict temperature adjustment control has been demanded in the semiconductor manufacturing field. For this purpose, a heater capable of heating a treatment furnace and the like to a desired state or a heater having directivity in radiation heat has been demanded. Particularly, in a heater for heating the treatment furnace from its lateral direction, appearance of a heater having increased radiation heat in the direction of the vertical plane (lateral direction) has been demanded. For example, if as shown in FIG. 29A, the aforementioned rod-like heater 470 is erected vertically, radiation heat in the direction of the vertical plane is increased.

However, because only a heating element 471 is provided, a region in which radiation heat is transmitted is small. Thus, to increase the radiation heat transmission region, it is necessary to provide with plural rod-like heaters adjacent the aforementioned rod-like heater 470. In this case, a quantity of connecting terminals 472 corresponding to the number of the rod-like heaters is required, thereby leading to increase of cost, which is a technical problem to be solved.

By forming a heating element 476 of a plate-like heater 475 meanderingly as shown in FIG. 29B, the region in which the radiation heat is transmitted in the direction of the vertical plane can be expanded. Further, in this case, the quantity of the connecting terminals 472 is not increased so much as the case of the rod-like heater 470. However, because the heating element 476 meandering vertically is formed with a predetermined gap t, there is a limit in increasing the radiation heat in the direction of the vertical plane.

As described above, the carbon wire heating element sealing heater is very excellent in views of prevention of impure metal pollution. The inventors of the present invention considered other applications thereof in the semiconductor manufacturing field. As a result, they have noticed that the technology can be applied to a fluid heating apparatus and reached the present invention.

SUMMARY OF THE INVENTION

The present invention has been accomplished to solve the above-described technical problems and a first object of the present invention is to provide a carbon wire heating element sealing heater in which generation of the black spots is suppressed, unevenness in heating is small and heat generation characteristic is excellent.

Further, the present invention has been accomplished to solve the above-described technical problems and a second object of the present invention is to provide a carbon wire heating element sealing heater in which contact between the carbon wire heating element and a glass pipe is prevented and breaking of the carbon wire heating element is blocked by accommodating the carbon wire heating element substantially in the center of the glass pipe.

Further, a third object of the present invention is to provide a carbon wire heating element sealing heater which suppresses diffusion of pollutant substance from the heater, particularly diffusion of such pollutant substance as impure metal from a heating element, pollution on a processing object is blocked, this carbon wire heating element sealing heater having directivity in radiation heat and capable of increasing radiation heat in a direction of vertical plane.

Further, a fourth object of the present invention is to provide a fluid heating apparatus which suppresses diffusion of pollutant substance from the heater, particularly diffusion of such pollutant substance as impure metal from a heating element, pollution on a processing object is blocked, this fluid heating apparatus having excellent gas residence property, capable of suppressing generation of particles and possible to reduce in size.

To achieve the first object of the invention, there is provided a carbon wire heating element sealing heater in which a carbon wire heating element using carbon fibers is sealed in a quartz glass member, wherein the quantity of water absorbed in the carbon wire heating element is $2 \times 10^{-3}$ g or less per 1 $cm^3$ of said carbon wire beating element. According to another aspect of the invention, there is provided a carbon wire heating element sealing heater in which a carbon wire heating element produced by knitting plural carbon fibers is sealed in a quartz glass member, wherein the quantity of water absorbed in the carbon wire heating element is $2 \times 10^{-3}$ g or less per 1 $cm^3$ of said carbon wire heating element.

The carbon wire heating element sealed in the quartz glass member contains a relatively larger water content absorbed therein. Thus, as shown in a following reaction formula, this absorption water content and the carbon wire react with each other when the temperature rises and at the time of cooling, its reacting molecule adheres to the inner face of the element pipe (quartz glass pipe) as the black spot.

Reaction formula $C + H_2O \leftrightarrow CO + H_2$

Therefore, to suppress the aforementioned reaction, the quantity of water absorbed in the carbon wire heating element to be sealed in the quartz glass member is set to $2 \times 10^{-3}$ g or less per 1 $cm^3$ of said carbon wiring heating element.

Because the carbon wire heating element sealing heater of the present invention utilizes a carbon wire heating element wherein the quantity of water absorbed in the carbon wire heating element is $2 \times 10^{-3}$ g or less per 1 $cm^3$ of said carbon wire heating element, generation of the black spots is suppressed so that an excellent heat generation characteristic having a small unevenness in heat generation can be obtained.

Preferably, the quartz glass member is tubular and a ratio between the diameter of the carbon wire heating element and the inside diameter of the quartz glass pipe is 1:2 to 5. If the ratio of the inside diameter of the quartz glass pipe is less than 2 when the diameter of the carbon wire heating element is assumed to be 1, a possibility that the carbon wire and the inner face of the quartz glass pipe make contact with each other is high and at a portion where they are not in contact, a distance from the carbon wire heating element to the inner face of the quartz glass pipe is very small. Therefore, if the aforementioned black spots occur, they are not scattered inside the quartz glass pipe, but concentrated on the inner face of the quartz glass pipe, located at the shortest distance.

As a result, the black spots are visible from the appearance of the carbon wire heating element sealing heater and unevenness in heat generation occurs at such a portion, which is not preferable.

On the other hand, if the ratio of the inside diameter of the quartz glass pipe exceeds 5 when the diameter of the carbon wire heating element is assumed to be 1, heat capacity of the quartz glass pipe increases so that heat response at the time of temperature rise/fall drops, which is not preferable.

Preferably, the U-shaped carbon wire heating element sealing heater having a straight heating element is provided and terminal portions are provided on both ends through bent portions, wherein the carbon wire is disposed off the center portion of the quartz glass pipe.

If a carbon wire heating element with a quantity of water absorbed in the carbon wire heating element is $2 \times 10^{-3}$ g or less per 1 $cm^3$ of said carbon wire heating element, even if the carbon wire heating element is disposed off the center of the quartz glass pipe, generation of the black spot is suppressed, so that a carbon wire heating element sealing heater having a small unevenness in heat generation and excellent heat generation characteristic can be obtained.

If the ratio of the inside diameter of the quartz glass pipe is 2 to 5 when the diameter of the carbon wire is assumed to be 1, even if the carbon wire is disposed off the center of the quartz glass pipe, generation of the black spots is suppressed so that a carbon wire heating element sealing heater having a small unevenness in heat generation and excellent heat generation characteristic can be obtained.

To achieve the second object of the present invention, there is provided the carbon wire heating element sealing heater in which anyone of the afore mentioned carbon wire heating element is sealed in the glass member, comprising: a glass pipe disposed at an end portion of the quartz glass member and for accommodating the end portion of the carbon wire heating element; a wire carbon member for nipping an end portion of the carbon wire heating element; and a terminal portion whose end is accommodated in the glass pipe and which contains a connecting wire for power supply nipped by compressed wire carbon members, wherein the wire carbon member is constituted of plural wire carbon bundles composed of wire carbon materials, and the carbon wire heating element is disposed substantially in the center of the glass pipe among the plural wire carbon bundles.

In the carbon wire heating element sealing heater of the present invention, the wire carbon member is constituted of plural wire carbon bundles each composed of the wire carbon materials and the carbon wire heating element is disposed among the plural wire carbon bundles and substantially in the center of the glass pipe.

That is, the wire carbon bundle has a function of a chucking portion of a drill, a drilling machine or the like, thereby trying to locate the carbon wire heating element in the center of the glass pipe. As a result, the carbon wire heating element is disposed substantially in the center of the glass pipe, thereby eliminating a possibility that the carbon wire heating element may make contact with the glass pipe.

Consequently, reaction between the glass pipe and the carbon wire heating element is avoided and breaking of the wire due to this reason is suppressed. Thus, the heater service life can be extended remarkably as compared to a conventional example. Further, because the carbon wire heating element runs substantially through the center of the plural wire carbon bundles, their resistance can be adjusted easily.

To achieve the second object of the present invention, there is provided the carbon wire heating element sealing heater in which any one of the aforementioned carbon wire heating element is sealed in the glass member, further comprising: a first glass pipe disposed at an end portion of the quartz glass member and for accommodating a part of the carbon wire heating element; a second glass pipe having the same axis as that of the first glass pipe and for accommodating an end portion of a power supply connecting wire for supplying electric power to the carbon wire heating element and an end portion of the carbon wire heating element; and a terminal portion accommodated in the first and second glass pipes in a compressed state and having a wire carbon member for nipping the carbon wire heating element and power supply connecting wire, wherein the wire carbon member is constituted of plural wire carbon bundles composed of wire carbon materials and the carbon wire heating element is disposed substantially in the center of the glass pipe among the plural wire carbon bundles.

In the carbon wire heating element sealing heater the present invention also, reaction between the glass pipe and the carbon wire heating element is avoided and breaking of the wire due to this reason is suppressed. Thus, the heater service life can be extended remarkably as compared to a conventional example. Further, because the carbon wire heating element runs substantially through the center of the plural wire carbon bundles, their resistance can be adjusted easily.

Particularly, according to the present invention, a part of the carbon wire heating element is accommodated in the first glass pipe while an end portion of the power supply connecting wire for supplying electric power and an end portion of the carbon wire heating element are accommodated in the second glass pipe.

Thus, the quantities of the wire carbon members in the second glass pipe for accommodating the end portion of the power supply connecting wire for supplying electric power and in the first glass pipe for accommodating a part of the carbon wire heating element can be changed.

Therefore, by making the quantity of the wire carbon member in the second glass pipe for nipping the end portion of the power supply connecting wire larger than that of the wire carbon member in the first glass pipe, the connecting wire can be nipped firmly thereby preventing electric resistance from becoming unstable.

Further, preferably, the quantity of the wire carbon members accommodated in the second glass pipe is larger than that of the wire carbon members accommodated in the first glass pipe.

By making the quantity of the wire carbon member in the second glass pipe larger than that of the wire carbon member in the first glass pipe, the connecting wire can be nipped firmly thereby preventing electric resistance from becoming unstable.

Preferably, the wire carbon bundles are accommodated in the glass pipe such that folded-back portions of the wire carbon bundles are located on an introduction side of the carbon wire heating element in the glass pipe for accommodating the end portion of the carbon wire heating element.

The wire carbon bundles are folded back and further, the folded-back portions of the wire carbon bundles are located on the introduction side of the carbon wire heating element in the glass pipe. Thus, dust and dirt are blocked from invading into the quartz glass member in which the carbon wire heating element is sealed from the end portion of the glass pipe.

Consequently, reaction between dust and an inner wall of the quartz glass member, adhesion thereof to the inner wall, unevenness in heat generation and the like can be prevented.

Further, this structure makes it easy to insert the connecting wire through the compressed wire carbon members and ensures that a tip portion thereof is fixed more firmly, thereby achieving stabilized supply of electric power.

Further, preferably, the glass pipe for accommodating an end portion of the carbon wire heating element is formed linearly, the carbon wire heating element and the wire carbon bundles are disposed substantially in parallel to axes of the glass pipes, and the carbon wire heating element is introduced from an end portion of the glass pipe.

Because the carbon wire heating element is disposed substantially in the center of the glass pipe even if the glass pipe for accommodating an end portion of the carbon wire heating element is formed linearly, the end portion of the glass pipe and the carbon wire heating element never make contact with each other.

Further, preferably, the first glass pipe for accommodating a part of the carbon wire heating element is formed linearly while the second glass pipe for accommodating end portions of the power supply connecting wire for supplying electric power to the carbon wire heating element and the carbon wire heating element is formed linearly, the carbon wire heating element and the wire carbon bundles are disposed substantially in parallel to axes of the first and second glass pipes, and the carbon wire heating element is introduced from an end portion of the first glass pipe.

In this case also, because the carbon wire heating element is disposed substantially in the center of the glass pipe, the end portion of the first glass pipe and the carbon wire heating element never make contact with each other like the previous example.

Further, preferably, a glass pipe for accommodating the carbon wire heating element is formed in a T shape while an end portion thereof is sealed, the carbon wire heating element and the carbon wire bundles are disposed substantially in parallel to the axes from an opening end portion of the glass pipe to a sealing end portion thereof, and the carbon wire heating element is preferably introduced from among the wire carbon bundles at a bent portion of the glass pipe.

Although a conventional heating element in which a terminal portion and carbon wire heating element are sealed in a glass member is structured through a L-shaped bent portion, this L-shaped glass pipe is changed to T shape, so that the carbon wire heating element and wire carbon bundles are disposed substantially in parallel to the axis from the opening end portion of the glass pipe up to the sealing end portion. The carbon wire heating element is introduced out from among the wire carbon bundles at the bent portion of the glass pipe.

The pressing function of the wire carbon member is exerted in an area from the bent portion to the sealing end portion. Thus, such an inconvenience that the wire carbon members are swollen at the bent portion so that the carbon wire heating element makes a pressing contact with an inner wall face, which has been seen in the conventional L-shaped glass pipe, can be avoided.

Further, the length of the glass pipe from the bent portion to the sealing end portion is preferred to be set to more than 1.5 times the inside diameter of the glass pipe extending from the bent portion.

Contrary to this, if the length of the glass pipe from the bent portion to the sealing terminal is less than 1.5 times the inside diameter of the extending glass pipe, the pressing function of the wire carbon members in the area from the bent portion to the sealing end portion is weak, so that like the conventional L-shaped glass pipe, the wire carbon members are swollen at the bent portion and the carbon wire heating element makes a pressing contact with the inner wall face.

In the mean time, the glass member and glass pipe are preferred to be made of quartz glass member. Further, the sheath pipe is preferred to be composed of quartz glass member.

Further to achieve the third object of the present invention, there is provided the carbon wire heating element sealing heater, comprising a heater portion made of quartz glass pipe for accommodating any carbon wire heating element, sealing terminal portions provided on both ends of the quartz glass pipe of the heater portion and a connecting terminal provided on the sealing terminal portion, wherein the heater portion is formed by winding the quartz glass pipe spirally vertically while the quartz glass pipe extending vertically is formed linearly and the quartz glass pipes on the top and bottom portions are formed circularly, and the sealing terminal portions are formed at end portions of the quartz glass pipes of the heater portion extended to sides of the same faces.

As described above, the quartz glass pipe is wound spirally in the vertical direction and the quartz glass pipe extending in the vertical direction is formed linearly. The quartz glass pipes on the top and bottom portions are formed circularly and both end portions of this quartz glass pipe are extended on the same face side, while the sealing terminal portion is formed at each end portion thereof.

Therefore, heat radiation from the carbon wire heating element is generated less at the circular quartz glass pipe and mainly made at the linear quartz glass pipe extending in the vertical direction. For the reason, heat radiation in the direction of a vertical plane or in the lateral direction can be increased.

Because the heater portion is formed by winding the quartz glass pipe spirally in the vertical direction, the linear quartz glass pipe is disposed in the back and forth direction relative to a radiation direction and further, if seen in the direction of the vertical plane (lateral direction) with respect to the quartz glass pipe, linear quartz glasses tube placed rearward are located in each interval between the quartz glass pipes placed forward. That is, radiation heat in the direction of the vertical plane (lateral direction) can be increased by radiation from the linear quartz glass pipes located forward and rearward. Further, it is possible to obtain heat radiation having a small local deflection in the direction of the vertical plane by adjusting that interval.

Further, the quartz glass pipes of the heater portion are extended on the same face side and the sealing terminal portion is formed at each end portion thereof.

Because the sealing terminal portion is formed on the same face side of the heater portion, connection to a power supply is made easy. An opposite side to the sealing terminal portion forming side acts across the heater portion acts as a radiation side. Therefore, radiation can be increased by disposing a reflecting plate or the like on the sealing terminal portion forming side.

I addition, there is provided the carbon wire heating element sealing heater of the present invention, comprising a heater portion made of quartz glass pipe for accommodating any one of the aforementioned carbon wire heating element composed of carbon fibers, sealing terminal portions provided on both ends of the quartz glass pipe of the heater portion and a connecting terminal provided on the sealing terminal portion, wherein the heater portion is formed by winding the quartz glass pipe spirally vertically while the quartz glass pipe extending vertically is formed linearly and the quartz glass pipes on the top and bottom portions are formed circularly, and the sealing terminal portions are formed at end portions of the quartz glass pipes of the heater portion extended to sides of the same faces, the sealing terminal portion including a glass pipe for accommodating an end portion of the carbon wire heating element and wire carbon member accommodated in the glass pipe in a compressed state and for nipping an end portion of the carbon wire heating element, the wire carbon member being constituted of plural wire carbon bundles each composed of wire carbon materials, the carbon wire heating element being disposed among the plural wire carbon bundles and substantially in the center of the glass pipe.

Such a carbon wire heating element sealing heater can achieve the above-described first, second and third objects at the same time. That is, it is possible to provide a carbon wire heating element sealing heater in which generation of the black spots is suppressed, heat generation characteristic is excellent with a small unevenness in heat generation, breaking of the carbon wire heating element is blocked, the carbon wire heating element sealing heater having a directivity in radiation heat and capable of increasing radiation heat in the direction of the vertical plane.

Preferably, the curvature radius of the quartz glass pipe formed circularly is twice to five times the outside diameter of the quartz glass pipe.

If the curvature radius is less than twice the outside diameter of the quartz glass pipe, when formed into circular, the inside of the quartz glass pipe is deformed, so that the carbon wire heating element may make a contact with the inner wall of the quartz glass pipe, which is not preferable.

Further, if the curvature radius exceeds five times the outside diameter of the quartz glass, the width of the heater increases and the radiation in the vertical direction increases, which is not preferable.

Further, preferably, the ratio between the thickness of the heater portion formed circularly of the quartz glass on the side of an outer peripheral portion and on the side of an inner peripheral portion is 1:1.1 to 2.

Because the thickness on the side of the inner peripheral portion is formed larger, heat capacity on the side of the inner peripheral portion can be set larger while radiation on the side of the inner peripheral portion can be set smaller.

Radiation heat from the linear quartz glass pipes disposed back and forth can be prevented from being radiated in a direction perpendicular to the direction of the vertical plane (longitudinal direction).

Further, this structure reinforces a portion having a large stress in the heater of the present invention in which its carbon wire heating element is accommodated in spirally wound quartz glass pipes by a predetermined pulling force, thereby preventing generation of a damage or the like.

Further, the circular quartz glass pipe is preferred to be formed with a gap of one to three times the outside diameter of the quartz glass pipe with respect to adjacent circular quartz glass pipe.

Winding of the quartz glass pipe densely is preferable because the radiation heat in the direction of the vertical plane (lateral direction) is increased.

However, because the heater portion is formed by winding the quartz glass pipe spirally in the vertical direction, the linear quartz glass pipe is disposed in the back/forth direction with respect to radiation direction. Therefore, if the glass pipe is wound too densely, radiation heat from the linear quartz glass pipe disposed in the back cannot be used effectively and the side of an inner peripheral face of the wound quartz glass pipe reaches an abnormally high temperature. To avoid this, the quartz glass pipe is preferred to be wound with a gap more than a time the outside diameter of the quartz glass pipe.

If the gap is three times or less, radiation having a smaller local deflection in the vertical direction can be obtained.

Preferably, the carbon wire heating element sealing heater further comprises a heater top holding member formed on the top such that it makes a contact with an inner face of the circular quartz glass pipe, a heater bottom holding member formed on the bottom such that it makes a contact with an outer face of the circular quartz glass pipe and a heater holding portion constituted of a linking member for linking the heater top holding member with the heater bottom holding member.

Because the heater holding portion is provided, mechanical strength of the heater portion can be increased thereby preventing a damage. Provision of the heater bottom holding member improves its installation performance. Further, heat capacity of the circularly formed portion of the quartz glass pipe increases, so that radiation in the vertical direction can be reduced.

Preferably, the heater top holding member is welded to the inside of a circular quartz glass pipe formed on the top while the heater bottom holding member is welded to the outside of the circular quartz glass pipe formed on the bottom.

Further, preferably, the carbon wire heating element sealing heater further comprises a heater top holding member formed on the top and provided inside the circular quartz glass pipe with a predetermined gap, a heater bottom holding member formed on the bottom such that it makes a contact with an outer face of the circular quartz glass pipe and a heater holding portion constituted of a linking member for linking the heater top holding member with the heater bottom holding member.

Because the predetermined gap is provided between the inside of the circular quartz glass pipe formed on the top and the heater top holding member, a collision between the quartz glass pipe and the heater top holding member due to vibration or the like can be avoided thereby preventing a damage. This gap is preferred to be more than 0.2 mm.

Further, preferably, a bottom face of the heater bottom holding member is located above the bottom face of the sealing terminal portion.

Because the bottom face of the heater bottom holding member is located above the bottom face of the sealing terminal portion, if the heater is placed on a horizontal plane, the bottom face of the heater bottom holding member never makes a contact with an installation surface. Therefore, even if vertical vibration is applied for the reason of the earthquake or the like, the bottom face of the heater bottom holding member never makes a contact with the installation surface, thereby protecting a portion linking the sealing terminal portion with the quartz glass pipe from a damage.

In the meantime, the bottom face of the heater bottom holding member is preferred to be located above the bottom face of the sealing terminal portion by 0.5 mm or more. If there is a difference in height of 0.5 mm or more, the bottom face of the heater bottom holding member never make a contact with the installation surface even if a vertical vibration occurs due to the earthquake or the like, thereby preventing a damage.

To achieve the fourth object, there is provided the fluid heating apparatus of the present invention comprising a heating pipe for heating fluid supplied from a fluid supply source, a heater portion formed around the heating pipe and made of quartz glass pipe for accommodating any one of the aforementioned carbon wire heating element and a housing for accommodating the heating pipe and the heater portion, wherein filler material resisting passing fluid is disposed inside the heating pipe while a diffusion plate is formed integrally with an upstream side face of the filler material.

Because filler material acting as resistance for passing gas is disposed within the heating pipe, the passing fluid can be provided with an appropriate residence time. As a result, the fluid passing through the heating pipe can be supplied with a sufficient heat by radiation heat from the heater portion so that the temperature can be raised to a predetermined one. Further, the fluid passing through the heating pipe can be made to remain, the sizes of the heating pipe and the heater portion can be reduced.

Particularly because the diffusion plate is formed integrally with the filler material on the upstream side face of the filler material, gas introduced into the inside of the heating pipe is diffused by the diffusion plate and gas flows through the entire face on the upstream side face of the filler material. Consequently, because gas flows through the entire region of the filler material, residence of gas is improved and heat exchange efficiency is improved.

Further, because the diffusion plate is formed integrally with the filler material on the upstream face side of the filler material, the filler material never partially drops and generation of particles or the like due to that reason can be prevented.

There is provided the fluid heating apparatus comprising a heating pipe for heating fluid supplied from a fluid supply source, a heater portion formed around the heating pipe and made of quartz glass pipe for accommodating any one of the aforementioned carbon wire heating element and a housing for accommodating the heating pipe and the heater portion, wherein filler material resisting passing fluid is disposed inside the heating pipe while a diffusion plate is formed integrally with an upstream side face of the filler material, the fluid heating apparatus comprising: a glass pipe for accommodating an end portion of the carbon wire heating element at an end portion of the heater portion; wire carbon member accommodated in the glass pipe in a compressed state and for nipping an end portion of the carbon wire heating element and a terminal portion accommodated in an end portion of the glass pipe and having a power supply connecting wire nipped by the compressed wire carbon member, the wire carbon member being constituted of plural wire carbon bundles each composed of wire carbon materials, the carbon wire heating element being disposed among the plural wire carbon bundles and substantially in the center of the glass pipe.

The fluid heating apparatus employing such a carbon wire heating element sealing heater can achieve the above-described first, second and fourth objects at the same time. That is, it is possible to provide a fluid heating apparatus in which generation of the black spots is suppressed, heat generation characteristic is excellent with a small unevenness in heat generation and breaking of the carbon wire heating element is blocked, the fluid heating capacity having an excellent gas residence property and capable of being further reduced in size.

Here, the diffusion plate is preferred to be formed integrally with the filler material on the downstream side face of the filler material. If the diffusion plate is formed integrally with the filler material on the downstream side face of the filler material, gas residence property can be improved. Further, the filler material never partially drops and generation of particles or the like for that reason can be prevented.

Further, preferably, the filler material is short-column like quartz glass bead, the diffusion plate is a quartz glass plate while the diffusion plate is fused with at least one face of the filler material formed by fusing the quartz beads together.

If the short-column like quartz glass beads are employed as the filler material and the diffusion plate is composed of a quartz glass plate, they can be integrated easily by fusion.

Further, preferably, the diffusion plate is composed of a disc-like quartz glass plate containing plural through holes and the ratio of openings per unit area by the through holes is larger on an outer peripheral portion than in the central portion.

Because the ratio of the openings per unit area on the outer peripheral portion is formed larger than in the central portion, gas introduced into the inside of the heating pipe is diffused toward the outer periphery of the heating pipe, so that gas flows from the entire face on the upstream face side of the filler material. As a result, gas flows through the entire region of the filler material, thereby improving gas residence property and heat exchange efficiency.

Further, because the heater portion is disposed around the outer periphery, more highly efficient heating can be achieved by diffusing gas in the direction of the outer periphery and heat exchange efficiency can be raised securely.

Preferably, the filler material formed by fusing the short-column like quartz glass beads together is a substance formed by fusing together two kinds of the beads, that is, bead of 6 to 12 mm in diameter and 6 to 12 mm in length and bead of 4 to 10 mm in diameter and 4 to 10 mm in length at the mixing rate of 1:4 to 4:1 in quantity.

Because the filler material composed of the substance formed by fusing the quartz beads together is disposed within the heating pipe, gas introduced into the heating pipe passes through fine passages bent and intersecting in complicated way, constituted of the filler material, so as to provide with suitable resident time. Radiation heat from the heater portion repeats transmission, refraction, scattering and reflection in complicated way inside the substance.

As a result, the introduced gas can be supplied with a sufficient heat quantity. Therefore, heat exchange efficiency is excellent and the sizes of the heating pipe and heater portion can be reduced.

Further, preferably, the porosity on a downstream side of the filler material formed by fusing the short-column like quartz glass beads is smaller on the porosity on the upstream side.

Because the porosity on the downstream side is formed smaller than that on the upstream side, gas residence property can be improved.

DETAILED DESCRIPTION OF PREFERRED EMBODIMENTS

A first embodiment of the carbon wire heating element sealing heater of the present invention will be described with reference to FIGS. 1 to 3.

Figure 1:
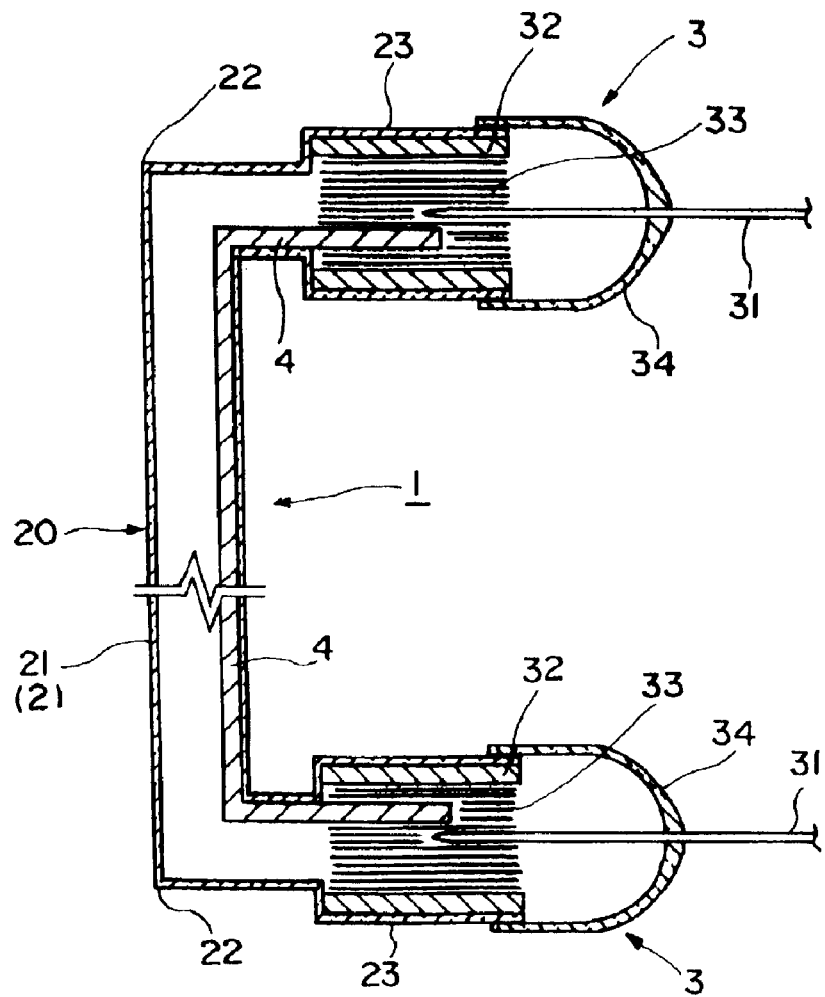
FIG. 1 is a diagram showing a heater in which the carbon wire heating element of the first embodiment of the present invention is sealed, more particularly a schematic sectional view of a carbon wire heating element sealing heater having a U-shaped section, having a straight heating section and terminal portions on both ends thereof via each bent section.
Figure 2:
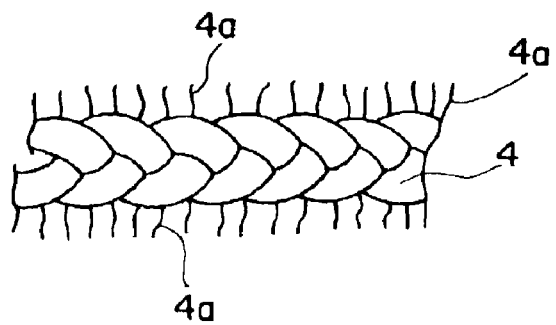
FIG. 2 is a schematic diagram of the carbon wire (heating element)

A carbon wire heating element sealing heater 1 is comprised of a straight heating portion 2 and terminal portions 3 provided on both ends of the heating portion 2 so that it is configured with a U-shaped section as shown in FIG. 1.

The heating portion 2 is constituted of a quartz glass pipe 20 accommodating a carbon wire (heating element) 4, which is a heating element composed of carbon wire fiber bundle and contains a straight portion 21. This quartz glass pipe 20 comprises the straight portion 21, bent portions which are bent on both ends thereof so as to be joined to each terminal portion 3 and large-diameter portions 23 each composing a part of the terminal portion 3.

Figure 3A:
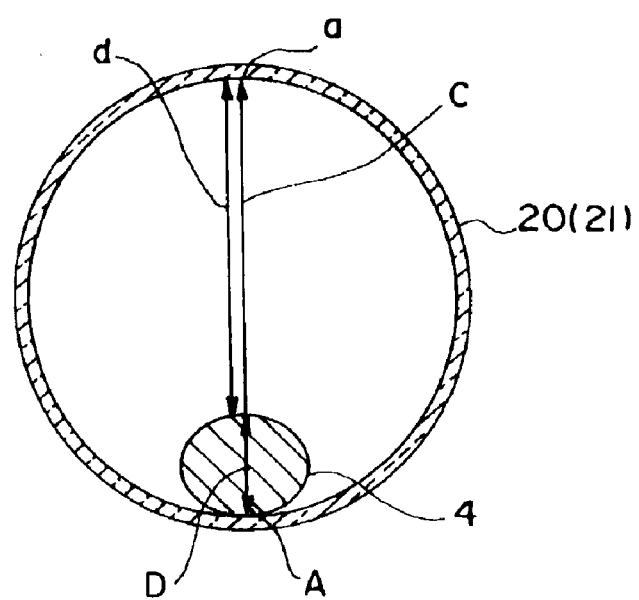
FIG. 3A is a schematic sectional view of a straight heating portion of the carbon wire heating element sealing heater, more specifically a diagram showing a case where a ratio between the diameter of the carbon wire and an inner diameter of quartz glass pipe is 2 to 5.

The inner diameter C of the quartz glass pipe 20 is formed such that if the diameter D of a carbon wire, which will be described later, is assumed to be 1, its ratio is 2 to 5 as shown in FIG. 3A. In the meantime, the carbon wire (heating element) may be deformed slight depending on a case, so that its section becomes elliptical. In this case, with a short diameter of this ellipse as 1, the inner diameter C of the quartz glass pipe 20 is determined so that the ratio is as shown above.

The terminal portion 3 has a connecting wire 31 and in a single heater 1, the terminal portions 3 require two ones as shown in FIG. 1. Because these terminal portions 3 have the same structure, one terminal portion 3 will be described.

This terminal portion 3 comprises a large-diameter portion 23 of the quartz glass pipe 20, a straight pipe 32 accommodated within the large-diameter portion 23, plural wire carbon materials 33 accommodated within the straight pipe 32 in compression state, a sealing glass pipe 34 for sealing an end portion of the quartz glass pipe 20 and the connecting wire 31 made of tungsten (W) provided on the sealing glass pipe 34.

The carbon wire (heating element) 4 is sandwiched among plural wire carbon materials 33 accommodated within the straight pipe 32 in compression state and connected and the connecting wire 31 is connected to this wire carbon materials 33.

Next, the carbon wire (heating element) 4 will be described with reference to FIG. 2.

This carbon wire (heating element) 4 is produced by knitting plural bundles of ultra fine carbon single-fibers into the shape of a knitted cord or braided rope and its heat capacity is smaller and its temperature rising/declining characteristic is more excellent than the conventional metallic SiC made heating element and further, it has an excellent high-temperature durability in the non-oxidizing atmosphere.

Because this carbon wire is manufactured by knitting plural bundles of fine carbon single-fibers, it has a higher flexibility than a heating element constituted of bare carbon material and its shape deformability and processability are more excellent.

More specifically, the aforementioned carbon wire (heating element) 4 for use is composed by knitting about 10 bundles each constituted of about 3000 to 3500 carbon fibers each having the diameter of 5 to 15 $\mu$m, for example, 7 $\mu$m into a knitted cord or braided rope about 2 mm in diameter.

Further, as the carbon wire (heating element) 4, a carbon wire with a quantity of water absorbed in the carbon wire heating element of $2 \times 10^{-3}$ g per 1 cm$^3$ of said carbon wire heating element is used.

Because the absorption water quantity of the carbon wire (heating element) 4 is small, reaction between absorption water and carbon wire is suppressed at the time of temperature rise. Consequently, adhesion of reactive molecules (black spot) onto an inner surface of a quartz glass pipe 20 is suppressed.

Even if reaction between absorbed water and carbon wire in a carbon wire heating element having a quantity of water absorbed therein of $2 \times 10^{-3}$ g or less per 1 cm$^3$ of said carbon wire heating element occurs, this reaction produces no black spot in this case, but only thin black film not affecting heat generation characteristic of a heater adheres to the inner surface of the quartz glass pipe 20.

Knitting span of the aforementioned carbon wire (heating element) is 2 to 5 mm. In the meantime, preferably, the knitted cord or braided rope carbon wire (heating element) has carbon fiber fuzz 4a on its surface and the fuzz mentioned here refers to protrusion of a cut portion or a part of the carbon fiber (single-fibers) from an outer surface of the carbon wire.

Preferably, the carbon fiber fuzz from the surface is 0.5 to 2.5 mm.

The carbon fiber is preferred to be composed of a high purity from viewpoints of equality in heat generating property, stability in durability and the like and in order to avoid dust generation and the quantity of impure substance contained in the carbon fiber is preferred to be 10 ppm or less in terms of ash weight. More preferably, the quantity of impure substance contained in the carbon fiber is 3 ppm or less.

When the carbon wire (heating element) 4 is inserted into the inside of the quartz glass pipe 20, preferably, only the fuzz 4a make contact with an inner wall of the quartz glass pipe but a main body (heating element) 4 of the carbon wire substantially does not make contact. Consequently, reaction between the quartz glass (SiO$_2$) and carbon (C) of the carbon wire under high temperatures is suppressed to a maximum extent thereby restricting deterioration of quartz glass and drop of durability of carbon wire.

Because as shown in FIG. 1, the carbon wire heating element sealing heater 1 is a heater having a U-shaped side configuration and comprising the straight heating portion 2 and the terminal portions 3 provided on both ends via the bent portions, the carbon wire (heating element) 4 is disposed off the center of the quartz glass 20.

That is, as shown in FIG. 3A, the carbon wire (heating element) 4 is disposed within the center of the quartz glass pipe 20 such that the carbon wire (heating element) 4 makes contact with the inner surface of the quartz glass pipe 20.

At this time, the inside diameter Cs of the quartz glass pipe 20 is formed so as to have the ratio of 2 to 5 when the diameter D of the carbon wire (heating element) 4 is assumed to be 1 as shown in FIG. 3A.

Because when the diameter D of the carbon wire (heating element) 4 is assumed to be 1, the inside diameter C of the quartz glass pipe 20 is formed to have the ratio of 2 to 5, area of a contact portion A between the carbon wire (heating element) 4 and the quartz glass pipe 4 can be reduced.

Figure 3B:
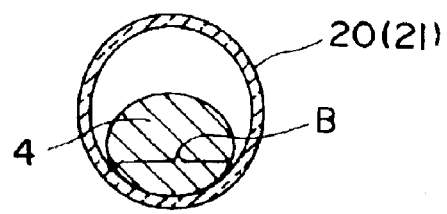
FIG. 3B is a schematic sectional view of a straight heating portion of the carbon wire heating element sealing heater, and more specifically a diagram showing a case where the ratio between the diameter of the carbon wire and the inner diameter of quartz glass pipe is less than 2.

On the other hand, if as shown in FIG. 3B, the ratio is less than 2 when the diameter D of the carbon wire (heating element) 4 is assumed to be 1, the area of the contact portion B between the carbon wire (heating element) 4 and the quartz glass pipe 20 is increased, which is not preferable.

Because the inside diameter C of the quartz glass pipe 20 is formed so as to have the ratio of 2 to 5, a distance d between the carbon wire (heating element) 4, even if it is a non-contacting portion, and an opposing face of the quartz glass pipe 20 is long.

For the reason, even if the aforementioned black spot (reacting molecule) is generated, it is diffused. Within the quartz glass pipe 20, so that thin black film is formed inside of the quartz glass pipe 20.

Because no black spot is formed concentrated on a specific portion of the quartz glass pipe 20, no heating unevenness is generated.

On the other hand, if the ratio of the inside diameter C of the quartz glass pipe exceeds 5 when the diameter D of the carbon wire (heating element) is assumed to be 1, the heat capacity of the quartz glass pipe 20 is increased, so that the heat response at the time of temperature rise/fall drops, which is not preferable. The black spot in the quartz glass pipe 20 is likely to be generated at a portion easy to cool.

Therefore, if the inside diameter C of the quartz glass pipe 20 is increased too much with respect to the diameter D of the carbon wire (heating element) 4 (the ratio of the inside diameter C of the quartz glass pipe exceeds 5 when the diameter D of the carbon wire (heating element) is assumed to be 1), the distance d in FIG. 3A is increased, so that the black spot becomes likely to be generated at the portion easy to cool.

In conclusion, it is preferable that the inside diameter C of the quartz glass pipe 20 is formed so as to have the ratio of 2 to 5 when the diameter D of the carbon wire (heating element) 4 is assumed to be 1.

Because carbon wire heating element sealing heater 1 having such a structure utilizes a carbon wire (heating element) 4 where the quantity of water absorbed in the carbon wire heating element is $2 \times 10^{-3}$ g or less per 1 cm$^3$ of said carbon wire heating element, generation of the black spot is suppressed even if electric power is supplied to the carbon wire (heating element) 4 and rise/fall of temperature is repeated, so that an excellent heat generation characteristic with little heating unevenness can be maintained.

The quantity of water absorbed in the carbon wire heating element is preferred to be $2 \times 10^{-3}$ g or less per 1 cm$^3$ of said carbon wire heating element in a state in which it is sealed in the quartz glass member. This is achieved by adjusting the absorption water quantity of the carbon wire heating element before sealing and condition for sealing the carbon wire healing element in the quartz glass member.

If the inside diameter C of the quartz glass pipe 20 is 2 to 5 times the diameter D of the carbon wire (heating element)

4, generation of the black spot is suppressed so that an excellent heat generation characteristic with little heating unevenness can be maintained.

EXAMPLE

A U-shaped carbon wire heating element sealing heater (straight portion length: 700 mm) was produced using carbon wires (heating element) having different absorption water quantities and temperature rise test was carried out under a following condition so as to confirm generation of the black spot. In the meantime, upon manufacturing of the heater, pressure inside the quartz glass pipe 20 was 1 torr at a heater temperature of 1200° C.

Temperature rise condition
Temperature rise atmosphere: atmosphere open system
Element temperature:
Operating time:
Table 1 shows a result of this temperature rise test.

TABLE 1

| Heater manufacturing condition | | Absorption water quantity ($g/cm^3$) | Quantity of pipes having the generation | Quantity of black spots (piece) |
|---|---|---|---|---|
| Inside diameter of quartz glass pipe (mm) | Ratio of pipe inside diameter when the wire diameter is 1 | | | |
| Comparative example 1 | 4 | 2 | $5 \times 10^{-5}$ | 5 of 5 | Infinite Infinite 9 9 10 |
| Example 1 | 4 | 2 | $1 \times 10^{-4}$ | 0 of 5 | 0 0 0 0 0 |

In the carbon wire heating element sealing heater using the carbon wire. (heating element) having a small absorption water quantity, no generation of the black spot was found.

Using four kinds of quartz glass pipes having different inside diameters, a carbon wire heating element sealing heater (straight portion: 800 mm) was manufactured and the temperature rise test was carried out under a following condition so as to confirm generation of the black spot. Upon manufacturing of the heater, pressure inside the quartz glass pipe 20 was 1 torr under a heater temperature of 1200° C. The quantity of water absorbed in the carbon wire for use was $1 \times 10^{-4}$ g or less per 1 $cm^3$ of said carbon wire.

Temperature rise condition
Temperature rise atmosphere: atmosphere open system
Element temperature:
Operating time:
Table 2 shows a result of this test.

TABLE 2

| Heater manufacturing condition | | | |
|---|---|---|---|
| Inside diameter of quartz glass pipe (mm) | Ratio of pipe inside diameter when the wire diameter is 1 | Quantity of pipe having the generation | Quantity of black spots (piece) |
| Comparative example 2 | 3 | 1.5 | 1 of 2 | 5 |
| Example 2 | 4 | 2 | 0 of 2 | 0 |

TABLE 2-continued

| Heater manufacturing condition | | | |
|---|---|---|---|
| Inside diameter of quartz glass pipe (mm) | Ratio of pipe inside diameter when the wire diameter is 1 | Quantity of pipe having the generation | Quantity of black spots (piece) |
| Example 3 | 6 | 3 | 0 of 2 | 0 |
| Example 4 | 10 | 5 | 0 of 2 | 0 |
| Comparative example 3 | 14 | 7 | 0 of 2 | 0 |

In case where the ratio of the inside diameter of the quartz glass pipe was 2 to 5 when the diameter of the carbon wire (heating element) was 1, it was recognized that generation of the black spots was suppressed. In the comparative example 3, the heat capacity was large and heat responsibility was inferior.

Using quartz glass pipes 3 mm, 10 mm in inside diameter, U-shaped carbon wire heating element sealing heaters were manufactured and temperature rise test was carried out under a following condition so as to recognize generation of the black spots. In the meantime, upon manufacturing a heater, pressure inside the quartz glass pipe 20 was 1 torr at a heater temperature of 1200° C. The quantity of water absorbed in the carbon wire for use was $1 \times 10^{-4}$ g or less per 1 $cm^3$ of said carbon wire heating element.

Temperature rise condition
Temperature rise atmosphere: temperature was raised with a heat insulation pipe set outside a heater pipe.
Element temperature:
Operating hour;
Table 3 shows a result of this test.

TABLE 3

| Heater manufacturing condition | | Short-time research result | | |
|---|---|---|---|---|
| Inside diameter of quartz glass pipe (mm) | Ratio of pipe inside diameter when the wire diameter is 1 | Black spot | Si, White spot | Quantity of pipes having the generation |
| Comparative example 4 | 3 | 1.5 | Infinite*1 0 Infinite*1 Infinite*1 Infinite*1 | Infinite*1 0 Infinite*1 Infinite*1 Infinite*1 | Four of Five |
| Example 5 | 10 | 5 | 0 0 2*2 0*3 0 | 0 0 0 0 0 | One of Five |

Notes:
*1 means that it generates on only straight portion (heating element) of quartz glass pipe.
*2 means that thin black film is generated on straight portion (heating element) of quartz glass pipe.
*3 means that black spot is generated on a large-diameter portion of the quartz glass pipe.

The comparative example 4 has not only generation of black spots but also white spots (Si). It has been confirmed that increasing the inside diameter of quartz glass pipe provides an effect of suppressing the black spots and white spots (Si).

As described above, the carbon wire heating element sealing heater of the present invention suppresses generation of the black spots, so that a carbon wire heating element sealing heater having an excellent heat generation characteristic can be obtained.

Next, the second embodiment of the carbon wire heating element sealing heater of the present invention will be described with reference to FIGS. 4A and 4B. This embodiment has a feature particularly in the terminal portion of the carbon wire heating element sealing heater. Like reference numerals are attached to the same components or similar ones to those shown in FIGS. 1 to 3 and a detailed description is omitted.

Figure 4A:
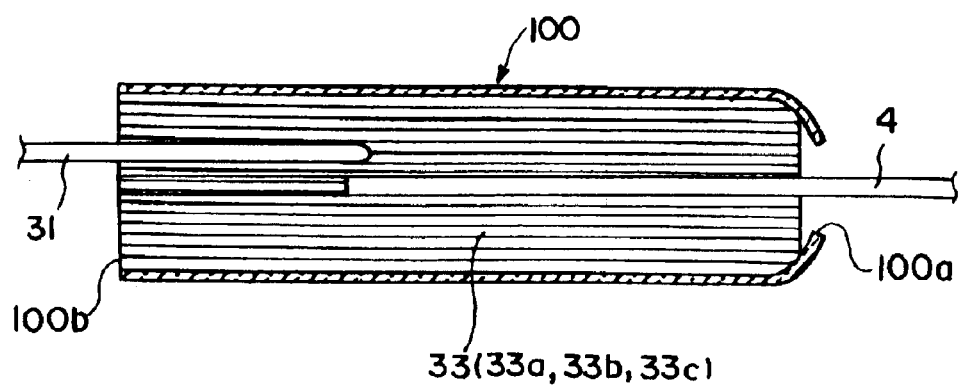
FIG. 4A is a schematic sectional view showing a terminal portion of the heater in which the carbon wire according to the second embodiment of the present invention is sealed, and more specifically a sectional view along the axis of a glass pipe.
Figure 4B:
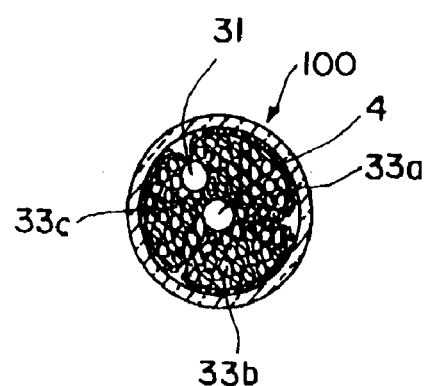
FIG. 4B is a schematic sectional view showing the terminal portion of a heater in which the carbon wire heating element according to the second embodiment of the present invention is sealed, and more specifically a sectional view perpendicular to the axis of the glass pipe.

A heater terminal portion shown in FIGS. 4A and 4B comprises a glass pipe 100 for accommodating a terminal portion of the carbon wire (heating element) 4, wire carbon members 33 which are accommodated in the glass pipe 100 in a compressed state and nip an end portion of the carbon wire heating element 4 and a connecting wire 31 for electric power supply, whose end portion is accommodated in the glass pipe 100 and which is nipped by the compressed wire carbon members 33. The glass pipe 100 is formed of quartz glass and has a cylindrical shape straight in its axis with both end portions open.

A quartz glass member (not shown) which constitutes a heater main body, is connected to an open end portion 100a of the glass pipe 100. The carbon wire heating element 4 is introduced from this open end portion 100a and placed inside the heater main body.

The open end portion 100a is slightly constricted to prevent internally filled material such as the carbon wire heating element 4, the wire carbon member 33 from jumping out. On the other hand, an open end portion 100b of the glass pipe 100 is sealed with other glass member (sealing glass pipe 34) with the connecting wire 31 introduced out.

This embodiment is different from the terminal portion shown in FIG. 1 in that the straight pipe 32 accommodated in the large-diameter portion 23 in FIG. 1 is not provided.

The wire carbon member 33 is constituted of three wire carbon bundles 33a, 33b, 33c, each bundle being composed of wire carbon materials. The carbon wire heating element 4 is placed among the three uniform wire carbon bundles 33a, 33b, 33c such that it is disposed substantially in the center of the glass pipe 100.

When the wire carbon bundles 33a, 33b, 33c are inserted and loaded into the inside of the glass pipe 100, these wire carbon bundles 33a, 33b, 33c have a function as a chucking portion of a drill or a drilling machine so as to position the carbon wire heating element 4 in the center of the glass pipe 100.

Consequently, the carbon wire heating element 4 is disposed substantially in the center of the glass pipe 100.

It is important that the carbon wire bundles are uniform and the quantity of the bundles is three or more odd number in order to dispose the carbon wire heating element 4 in the center of the glass pipe 100. If the quantity of the wire carbon bundles is even or those bundles are not uniform, it is difficult to dispose the carbon wire heating element 4 in the center of the glass pipe 1.

Thus, the wire carbon bundles 33a, 33b, 33c are preferred to be as uniform as possible. For example, if the wire carbon bundles 33a, 33b, 33c are structured using eight wire carbon materials in total, preferably, two wire carbon bundles each composed of three wire carbon materials are formed while a wire carbon bundle composed of two wire carbon materials is formed.

If the quantity of the wire carbon bundles is three or more odd number, it is difficult to load them into the glass pipe 10 in a compressed state.

Therefore, it is particularly preferable to provide with three uniform wire carbon bundles.

The carbon wire (heating element) 4 used in the first embodiment is used. As this wire carbon material, the same one as the carbon wire heating element 4 is used and about 10 bundles each composed of about 3000 to 3500 carbon fibers having the diameter of 5 to 15 $\mu$m, for example, 7 $\mu$m, are knitted into a knitted cord or a braided rope about 2 mm in diameter as a carbon wire.

As the wire carbon material, a carbon wire having a quantity of water absorbed in the carbon wire of $2\times10^{-3}$ g per 1 $cm^3$ of said carbon wire is used and the same carbon wire 4 as the first embodiment about knitting span and fuzz of carbon single-fibers is employed.

According to a preferred embodiment of the present invention, a bundle of 2 to 4 wire carbon materials is referred to as wire carbon bundle. As a result, a spring performance is applied in the diameter direction of the wire carbon member so that end portions of the wire carbon heating element can be nipped firmly.

The total number of the wire carbon bundles 33a, 33b, 33c is preferred to be larger than at least the quantity of the carbon wire heating elements 4 to be buried therein and if the quantity of the wire carbon bundles is five or more times that of the carbon wire heating elements, preferably, electric resistance is reduced thereby suppressing heat generation from the wire carbon bundles 33a, 33b, 33c.

Figure 5:
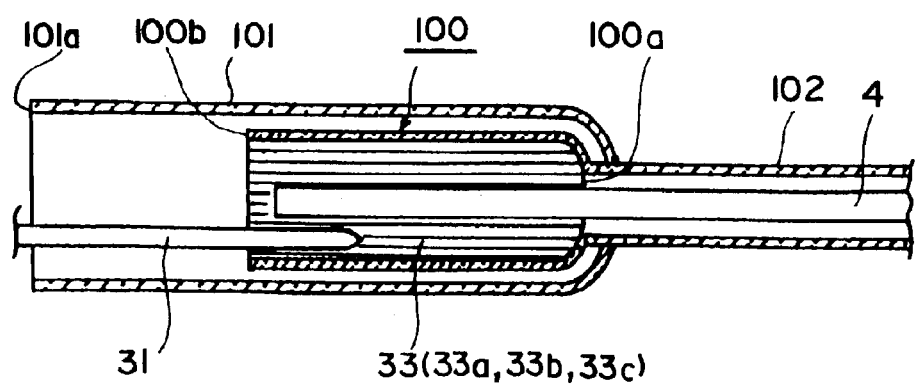
FIG. 5 is a sectional view showing the terminal portion adopting the terminal portion shown in FIG. 4.

FIG. 5 shows a terminal portion to which the terminal portion shown in FIGS. 4A and 4B is applied. This terminal portion is provided with a sheath pipe 101 for accommodating the aforementioned glass pipe 100 and a quartz glass member 102 of the heater main body is formed integrally with the sheath pipe 101.

Therefore, as a manufacturing method for the terminal portion shown in FIG. 4, a manufacturing method for the terminal portion shown in FIG. 5 may be used. Thus, the terminal portion shown in FIG. 5 will be described here while a description about the manufacturing method for the terminal portion shown in FIGS. 4A and 4B is refrained.

(1) First, after passing through the inside of the sheath pipe 101 made of quartz glass, an end portion of the carbon wire heating element 4 is passed through the inside of the glass pip 100.

(2) Next, the wire carbon bundles 33a, 33b, 33c are folded back and a guide string is attached to each of their folded back portions. Then, the wire carbon bundles 33a, 33b, 33c are pulled into the glass pipe 100 by taking care so that the guide strings do not entangle with each other with the carbon wire heating element 4 located in the center of the glass pipe 100.

Because the wire carbon bundles 33a, 33b, 33c are folded back, the quantity of the wire carbon materials of each bundle doubles within the glass pipe 100.

(3) The guide string is pulled further while adjusting the wire carbon bundles 33a, 33b, 33c so that the carbon wire heating element 4 is located in the center of the wire carbon bundles 33a, 33b, 33c and the folded back portions of the wire carbon bundles 33a, 33b, 33c are located at an open end portion 100a of the glass pipe 100. Because the carbon wire heating element is accommodated (fixed) within the glass pipe 100 such that it is compressed by the wire carbon bundles having the folded back portions, a high fixing force can be maintained.

(4) Portions of the wire carbon bundles 33a, 33b, 33c protruding from an end portion of the glass pipe 100 are cut off.

(5) After that, the glass pipe 100 is inserted into the sheath pipe 101 of quartz glass and resistance value is adjusted by adjusting tension of the carbon wire heating element 4 and finally, then the open end portion 101a of the sheath pipe 101 is closed.

The wire carbon member 33 is comprised of plural the wire carbon bundles 33a, 33b, 33c each produced by gathering wire carbon material together and the carbon wire heating element 4 is disposed among the plural the carbon wire bundles 33a, 33b, 33c such that it is located substantially in the center of the glass pipe.

That is, the wire carbon bundles 33a, 33b, 33c achieve a function like a chuck portion of a drill or a drilling machine so as to locate the carbon wire heating element 4 in the center of the glass pipe 100.

As a result, the carbon wire heating element 4 is disposed substantially in the center of the glass pipe 100 so that it does not make contact with the glass pipe 100 and can be introduced out.

Consequently, reaction between the glass pipe 100 and the carbon wire heating element 4 is avoided thereby suppressing breaking of wire due to this reason, and thus, the heater service life can be prolonged remarkably as compared to a conventional example. Further, because the carbon wire heating element 4 is passed substantially in the center of the wire carbon bundles 33a, 33b, 33c, its resistance can be adjusted easily.

Because the folded back portions of the wire carbon bundles 33a, 33b, 33c exist on the introduction side (opposite side to the connecting wire) of the carbon wire heating element 4 of the glass pipe 100 which accommodates the end portion of the carbon wire heating element 4, it prevents dust and dirt from entering into the quartz glass member 102 for sealing the carbon wire heating element 4 through the end portions of the wire carbon bundles 33a, 33b, 33c and the dust and dirt from reacting with an inner wall of the quartz glass member 102 and adhering to generate heating unevenness.

Further, this structure facilitates insertion of the connecting wire into a compressed wire carbon member and enables the tip portion of this connecting wire to be fixed more firmly so as to achieve stabilized power supply.

In the mean time, the quantity of water absorbed in the carbon wire heating element 4 is preferred to be $2 \times 10^{-3}$ g or less per 1 $cm^3$ of said carbon wire heating element in the condition that this is sealed within the quartz glass member. Consequently, generation of the black spot is suppressed, so that a carbon wire heating element sealing heater having an excellent heat generation characteristic can be obtained.

Further, the terminal portion of the second embodiment will be described with reference to FIGS. 6A to 8.

Figure 6A:
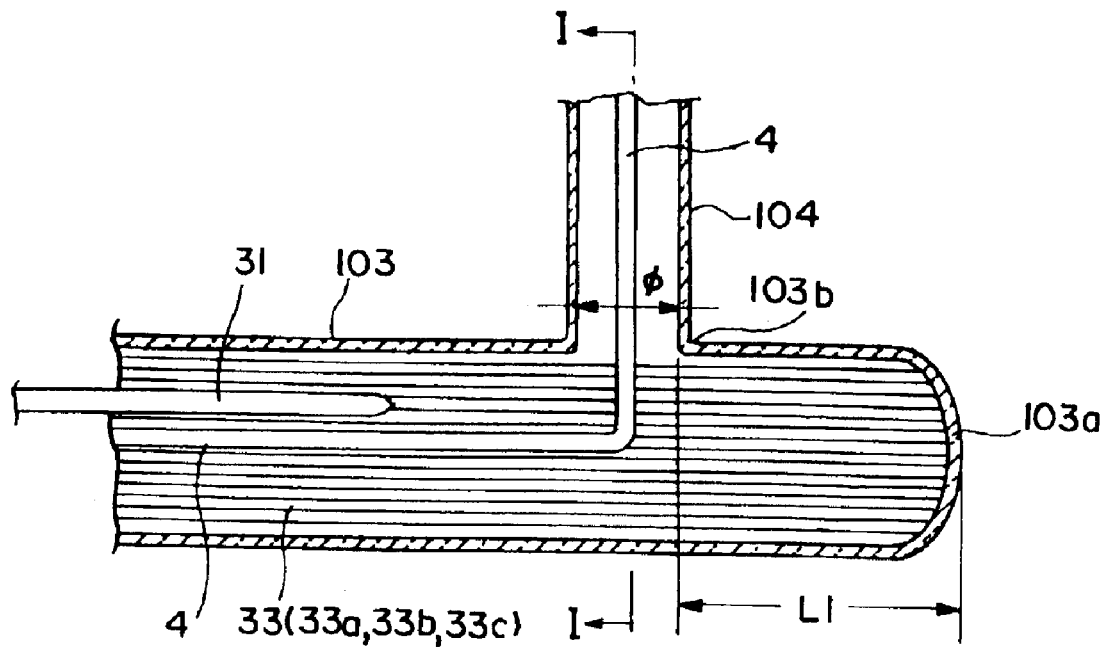
FIG. 6A is a schematic sectional view showing a modification of the terminal portion of the heater in which the carbon wire heating element is sealed, and more specifically a sectional view along the axis of the glass pipe.
Figure 6B:
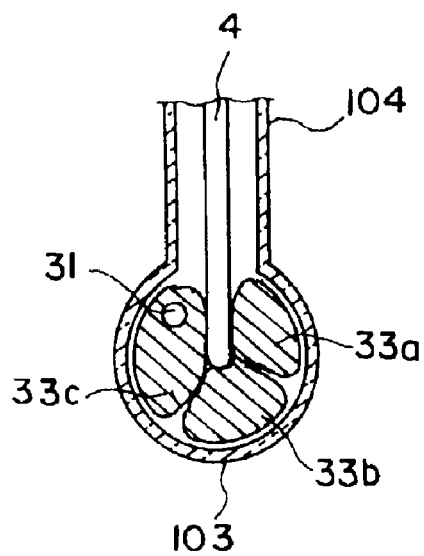
FIG. 6B is a sectional view along the line I—I of FIG. 6A.

According to this embodiment, as shown in FIGS. 6A and 6B, a glass pipe 103 for accommodating the carbon wire heating element 4 is formed in the shape of letter T while a sealing end portion 103a is formed at an end thereof and a spiral type glass pipe 104 for the heater main body is extended from a bent portion 103b.

The carbon wire heating element 4 and the wire carbon bundles 33a, 33b, 33c are disposed substantially in parallel to each other from an open end portion 103c and the sealing end portion 103a of the glass pipe 103 and the carbon wire heating element 4 is introduced from among the wire carbon bundles 33a, 33b, 33c at the bent portion 103b of the glass pipe 103.

A length L1 of the glass pipe 103 from the bent portion 103b to the sealing end portion 103a is set to 1.5 times or more the inside diameter of the glass pipe 104 extended from the bent portion 103b.

Figure 8:
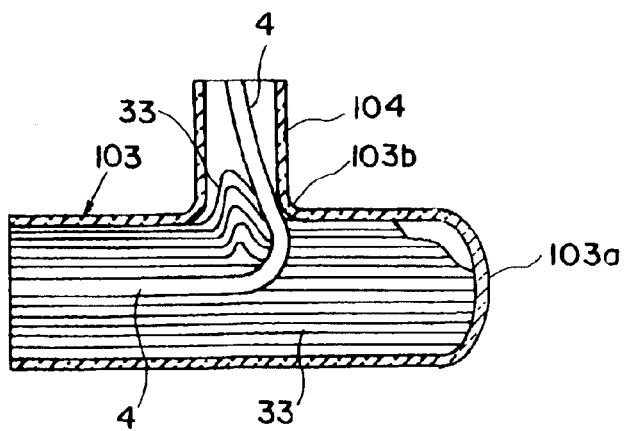
FIG. 8 is a sectional view showing a case in which the length from a bent portion of a glass pipe to its sealing end portion is less than 1.5 times the inner diameter of an extended glass pipe.

Because the carbon wire heating element 4 is disposed among the three wire carbon bundles 33a, 33b, 33c and located substantially in the center of the glass pipe 103, such an event that as shown in FIG. 8, the wire carbon members 33 placed from the bent portion 103b to the sealing end portion 103a are swollen at the bent portion 103b so that the carbon wire heating element 4 makes a contact with the inner wall with a pressure never occurs.

If the length of the glass pipe 103 from the bent portion 103b to the sealing end portion 103a is less than 1.5 times the inside diameter of the extended glass pipe, pressing function of the wire carbon member 33 from the bent portion 103b to the sealing- end portion 103a is weak, so that as shown in FIG. 8 (like a conventional L-shaped glass pipe), such a problem that the wire carbon members 33 are swollen at the bent portion 103b and the carbon wire heating element 2 makes a contact with the inner wall with a pressure is likely to occur.

Because the carbon wire heating element 4, the wire carbon materials, wire carbon bundles 33a, 33b, 33c and connecting wire 31 in this modification are the same as described above, description of these components is omitted.

Figure 7:
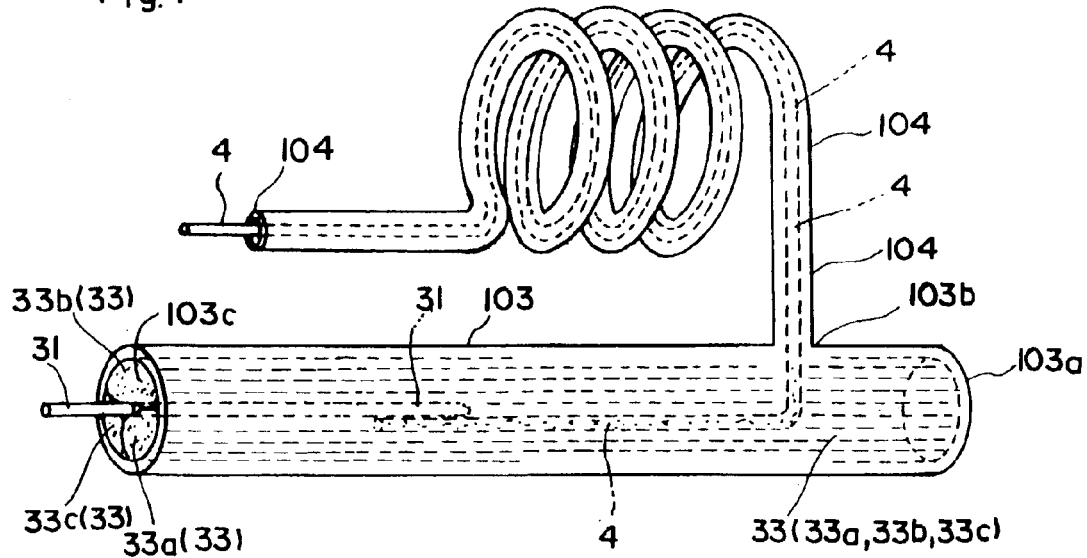
FIG. 7 is a diagram showing the entire structure of the carbon wire heating element sealing heater employing the terminal portion shown in FIG. 6.

Next, a manufacturing method will be described based on FIG. 7.

(1) The carbon wire heating element 4 is passed from the open end portion 103c of the glass pipe 103 through the bent portion 103b and then through the spiral glass pipe 104 and introduced out from the open end portion 104a of the glass pipe 4.

(2) Next, the wire carbon bundles 33a, 33b, 33c are folded back and a guide string is attached to each of the folded back portions. This guide string is introduced out from the open end portion 103a of the glass pipe 103 before sealing.

Then, the wire carbon bundles 33a, 33b, 33c are pulled into the glass pipe 103 by taking care so that the guide strings do not entangle with each other with the carbon wire heating element 4 located in the center of the glass pipe 103. Because the wire carbon bundles 33a, 33b, 33c are folded back, the quantity of the wire carbon materials of each bundle doubles within the glass pipe 103.

(3) The guide string is pulled further while adjusting the wire carbon bundles 33a, 33b, 33c so that the carbon wire heating element 4 is located in the center of the wire carbon bundles 33a, 33b, 33c and the folded back portions of the wire carbon bundles 33a, 33b, 33c are located at an open end portion 103a of the glass pipe 103. Because the carbon wire heating element is accommodated (fixed) within the glass pipe 103 such that it is compressed by the wire carbon bundles having the folded back portions, a high fixing force can be maintained.

(4) Portions of the wire carbon bundles 33a, 33b, 33c protruding from an end portion 103c of the glass pipe 103 are cutoff. After that, the open end portion 103a is fused together with heat so as to form a sealing end portion.

Resistance is adjusted by adjusting tension of the carbon wire heating element 4 and finally, the open end portion of the glass pipe and its heater side open end portion are closed.

Figure 9:
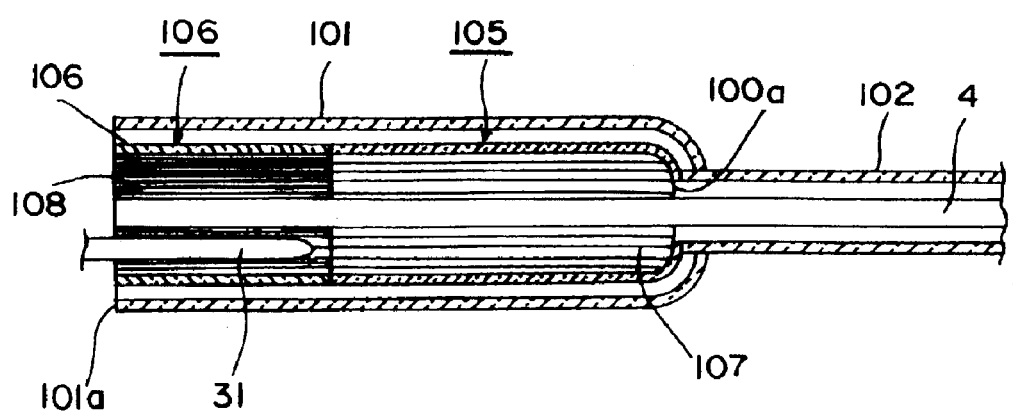
FIG. 9 is a sectional view showing other modification of the terminal portion.

A modification of the terminal portion shown in FIG. 5 will be described with reference to FIG. 9. Like reference numerals are attached to the same members as or similar ones to the members shown in FIG. 5, a detailed description thereof is omitted.

This modification has such a feature that the glass pipe 100 shown in FIG. 5 is divided to two sections. That is, this modification includes a first glass pipe 105 for accommodating a part of the carbon wire heating element 4 and a second glass pipe 106 for accommodating the end portion of the connecting wire 31 for supplying electric power to the carbon wire heating element 4 and the end portion of the carbon wire heating element 4 and having the same axis as the first glass pipe 105.

Like the wire carbon member 33 at the terminal portion shown in FIG. 5, the first and second glass pipes 105, 106 accommodate wire carbon members 107, 108 for nipping the carbon wire heating element 4 and the electric power supplying connecting wire 31 in a compressed state.

The wire carbon members 107, 108 are composed of plural wire carbon bundles each composed of wire carbon materials like the wire carbon members 33 and the carbon wire heating element 4 is disposed among the plural the wire carbon bundles and substantially in the center of the glass pipe 105. In the mean time, the carbon wire heating element 4 and the wire carbon members 107, 108 are disposed substantially in parallel to the first and second glass pipes 105, 106.

Part of the carbon wire heating element 4 is accommodated in the first glass pipe 105 and an end portion of the connecting wire 31 for supply electric power and an end portion of the carbon wire heating element 4 are accommodated in the second glass pipe 106. For the reason, the quantities of the wire carbon members 107, 108 can be adjusted in the first and second glass pipes 105, 106.

Thus, the wire carbon members 108 can be accommodated densely within the second glass pipe 106 for accommodating the connecting wire 31 whose connecting condition with the wire carbon members is likely to be changed due to vibration or the like. As a result, a specific connecting condition is maintained between the connecting wire 31 and the wire carbon members 108 thereby stabilizing electric resistance value.

If speaking specifically, if, the length of the glass pipe 100 shown in FIG. 5 is 300 mm or more, when the wire carbon member 33 is inserted and accommodated, its frictional resistance is increased, so that the wire carbon members 33 cannot be accommodated densely. Consequently, the nipping of the end portion of the connecting wire 4 becomes unstable, so that electric resistance value changes if vibration is applied to the terminal portion.

Thus, if the length of the glass pipe is 300 mm or more, the glass pipe is divided to two sections and the quantity of the wire carbon members 108 in the second glass pipe 106 for nipping the end portion of the connecting wire 31 is made larger than the quantity of the wire carbon members 107 in the first glass pipe 105 so as to pass, accommodate, nip the connecting wire 31 firmly.

Because the wire carbon members 3 for nipping the end portion of the connecting wire 31 can be accommodated densely, deflection of the electric resistance value is suppressed despite vibration applied on the terminal portion, thereby stabilizing electric resistance.

Next, a manufacturing method for the terminal portion shown in FIG. 9 will be described.

(1) After passing through the inside of the sheath pipe 101 made of quartz glass, an end portion of the carbon wire heating element 4 is passed through the inside of the glass pipes 105, 106.

(2) Next, plural the wire carbon bundles are folded back and a guide string is attached to each of the folded back portions. Then, the wire carbon bundles are pulled into the first and second glass pipes 105, 106 while taking care so that the guide strings do not entangle with each other. At this time, the carbon wire heating element 4 is kept in the center of the first and second glass pipes 105, 106. Then, the folded back portions of the wire carbon bundles are located at the open end portion of the first glass pipe 105.

(3) After that, the first glass pipe 105 is inserted into the sheath pipe 101 made of quartz glass.

(4) Another wire carbon bundle is folded back and the guide string is attached to the folded back portion. Then, the guide string is passed through only the inside of the second glass pipe 106 and this wire carbon bundle is pulled into the inside of the second glass pipe 106, so that the folded back portion is located at the open end portion of the second glass pipe 106.

Meanwhile, when the plural the wire carbon bundles are pulled in, it is permissible to pass that guide string through the inside of the second glass pipe 106 at the same time.

Thus, as compared to a case for the first glass pipe 105, two wire carbon bundles (two wire carbon bundles are produced because a single wire carbon bundle is folded back) are accommodated within the second glass pipe 106.

(5) After that, the second glass pipe 106 is inserted into the sheath pipe 101 made of quartz glass. At this time, the second glass pipe 106 is inserted up to a position where an end face of the second glass pipe 106 makes contact with an end face of the first glass pipe 105.

(6) Portions of the wire carbon bundle protruding from an end portion 106a of the second glass pipe 106 is cut out and removed.

(7) After that, electric resistance value is adjusted by adjusting tension of the carbon wire heating element 4, the connecting wire 31 is inserted into the second glass pipe 106 and finally, the open end portion 101a of the sheath pipe 101 is closed firmly and completed.

As a result, the quantity of the wire carbon members 108 in the second glass pipe 106 which nips the end portion of the connecting wire 31 can be made larger than the quantity of the wire carbon members 107 in the first glass pipe 105, so that the connecting wire 31 inserted into the second glass pipe 106 can be nipped firmly.

The quantity of water absorbed in the carbon wire heating element 4 is preferred to be $2 \times 10^{-3}$ g or less per 1 cm$^3$ of said carbon wire heating element in the condition that it is sealed in the quartz glass member. As a result, generation of the black spot during usage is suppressed, so that a carbon wire heating element sealing heater having an excellent heat generation characteristic can be obtained.

Because according to the second embodiment, the carbon wire heating element can be disposed substantially in the center of the glass pipe for accommodation, a contact between the glass pipe and the carbon wire heating element can be blocked and thus, a heater in which breaking of the carbon wire heating element is blocked can be obtained.

Figure 10:
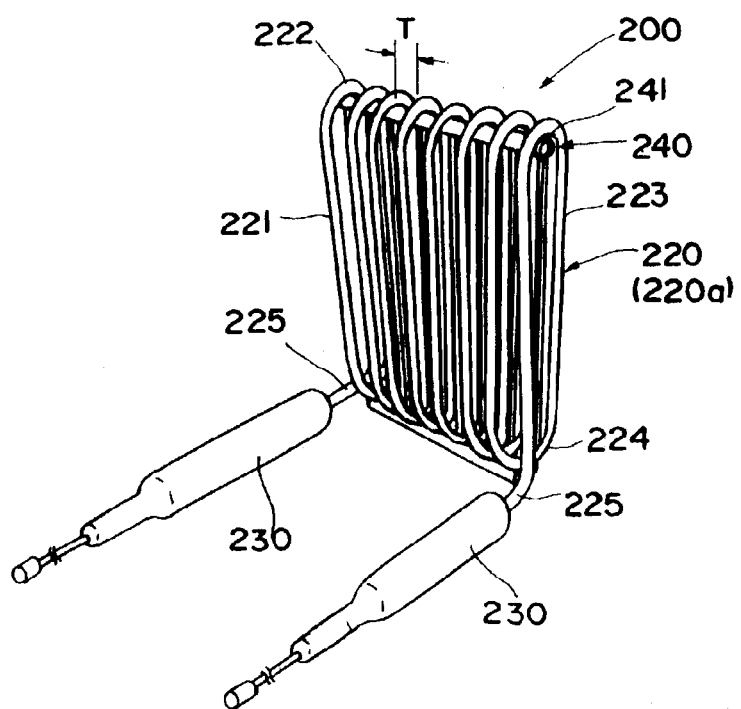
FIG. 10 is a perspective view showing a third embodiment of the carbon wire heating element sealing heater of the present invention.

Next, a third embodiment of the carbon wire heating element sealing heater of the present invention will be described with reference to FIGS. 10 to 14. As shown in FIG. 10, this heater (carbon wire heating element sealing heater) 200 comprises a heater portion 220, sealing terminal portions 230 provided on both ends of the heater portion 220 and a heater holding portion 240 for holding the heater portion 220.

In this heater portion 220, its heat generating portion is constituted of a quartz glass pipe 220a which accommodates the carbon wire heating element 4 composed of carbon fiber bundles and formed spirally with linear portions and circular portions. The same carbon wire heat generating element 4 as the first embodiment is used.

That is, the quartz glass pipe 220a is wound spirally in the vertical direction. The quartz glass pipe 220a extended vertically is formed linearly while the quartz glass pipe 220a at the top and bottom portions are formed circularly.

Figure 11:
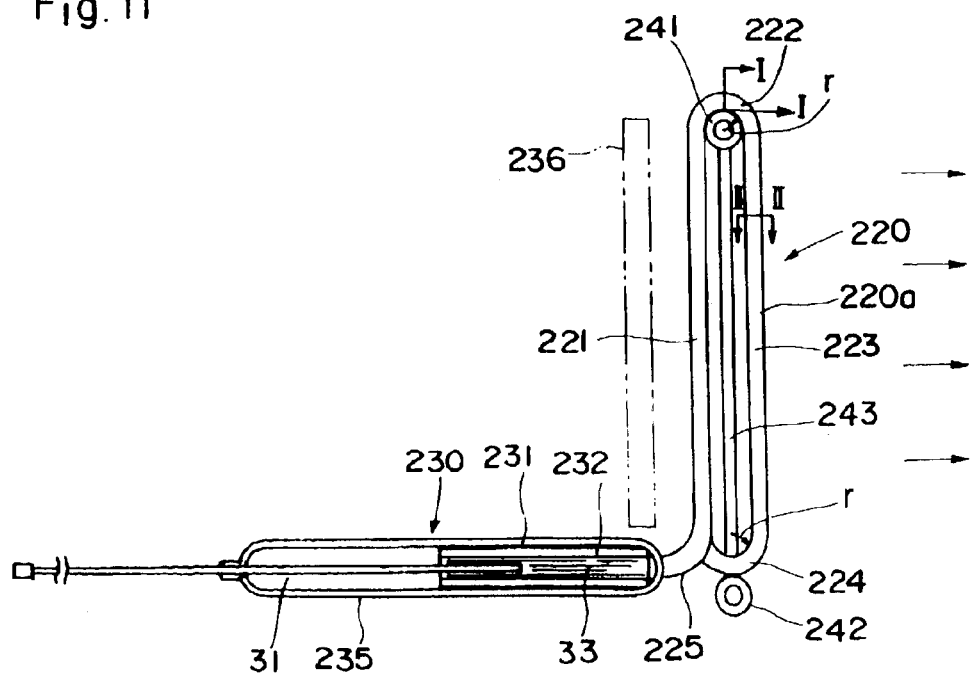
FIG. 11 is a side view of the sealing end portion of the carbon wire heating element sealing heater shown in FIG. 10.

If speaking further in detail, as shown in FIGS. 10 and 11, this quartz glass pipe 220a comprises introduction portions 225 connected to the sealing terminal portions 230 and extended horizontally, a first linear portion 221 leading from the introduction portion 225 and extended upward linearly, top circular portion 222 extended from the first linear portion 221, a second linear portion 223 extended linearly downward from the top circular portion 222 and a bottom circular portion 224 extended from the second linear portion 223.

The quartz glass pipe 220a is formed spirally by connecting the first straight portion 221, the top circular portion 222, the second straight portion 223 and the bottom circular portion 224 and then repeating this combination by connecting to the first straight portion 221 again and by winding several times. Finally, the bottom circular portion 24 is connected to the introduction portion 225, which is connected to other sealing terminal portion 230.

The carbon wire heating element 4 is accommodated inside this quartz glass pipe 220a and this carbon wire heating element 4 is wound from the sealing terminal portion 230 through the introduction portion 225, the first straight portion 221, the top circular portion 222, the second straight portion 223 and the bottom circular portion 224 several times and after that, introduced to the other sealing terminal portion 230.

The introduction portions 225 are provided on the same face side and the sealing terminal portions 230 are formed on one side of the heater portion 220.

Because the heater portion 220 is formed by winding the quartz glass pipe 220a spirally in the vertical direction, the straight quartz glass pipes 220a (221, 223) are disposed before and after in the radiation direction. That is, radiation from the straight quartz glass pipes 220a (221, 223) disposed before and after increases radiating heat in the direction of a vertical plane (lateral direction) as indicated by an arrow of FIG. 11.

Because the sealing terminal portions 230 are formed on the same face side of the heater portion 220, they can be connected to a power source (not shown) easily. An opposite side to the formation side of the sealing terminal portions 230 across the heater portion 220 serves as the radiation side. Thus, disposing a reflecting plate 236 on the formation side of the sealing terminal portion 230 can increase the radiation further. As this reflecting plate 236, it is preferable to employ the one containing a thermal expansion black lead sheet sealed between two quartz glass plates from outside atmosphere in viewpoints of improvement of high purity characteristic and reflection efficiency. It is preferable to provide this integrally with the sealing terminal portions 230, the introduction portions 225 or the heater holding portion 240 by welding in viewpoints of space saving.

Figure 12A:
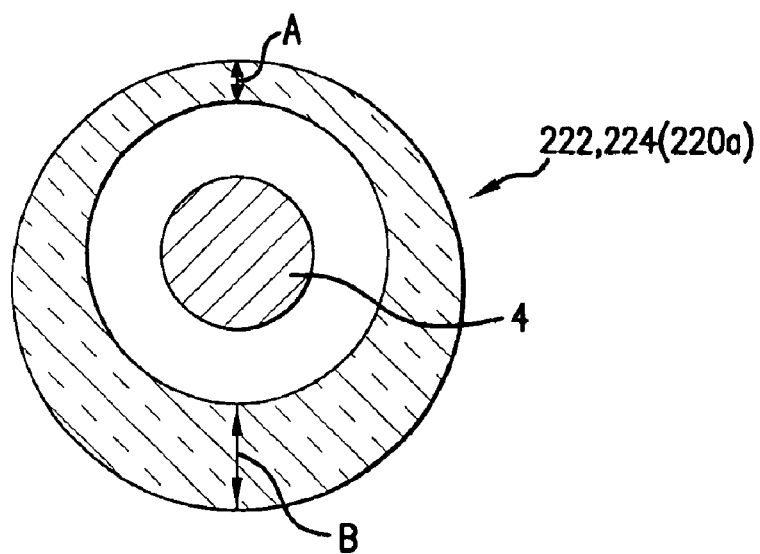
FIG. 12A is a diagram showing a section of the quartz glass pipe and more specifically a sectional view along the line I—I of FIG. 11.
Figure 12B:
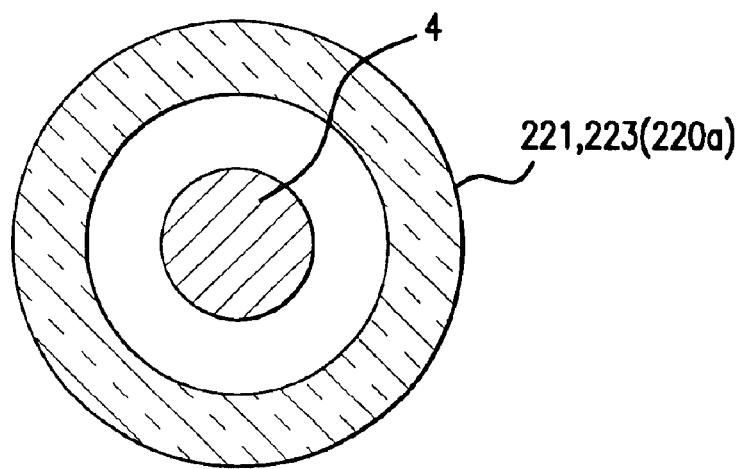
FIG. 12B is a diagram showing a section of the quartz glass and more specifically a sectional view along the line I—I of FIG. 11.

As shown in FIG. 12B, the thickness of first and second straight portions 221, 223 of the quartz glass pipe 220a is formed substantially equally.

On the other hand, as shown in FIG. 12A, the thickness of the top circular portion 222 and the bottom circular portion 224 is formed such that the thickness B of its inner peripheral side is larger than the thickness A of its outer peripheral side. More specifically, the thickness B of the inner peripheral side is formed 1.1–2 times larger than the thickness A of the outer peripheral portion. The outside diameter and the inside diameter of each of the first and second straight portions 221, 223, the top circular portion 222 and the bottom circular portion 224 are formed under the same dimensions.

Because the thickness B of the inner peripheral side is formed larger, its heat capacity is larger than the other portions. Thus, at the top circular portion 222 and the bottom circular portion 224, heat radiation in the direction of the inner periphery is weaker than heat radiation in the direction of the outer periphery.

Further, radiating heat from the straight quartz glass pipes disposed before and after can be prevented from being radiated in a direction perpendicular to the vertical plane direction (longitudinally).

Further, this structure reinforces a portion having a high stress in the heater of the present invention which accommodates the carbon wire heating element within a quartz glass pipe wound spirally with a predetermined tensile force thereby preventing generation of damage or the like.

The curvature radius r of each of the top circular portion 222 and the bottom circular portion 224 is formed to be twice or more to five times or less the outside diameter of the quartz glass pipe 220a.

If this curvature radius r is less than the quartz glass pipe 220a, the inside of the quartz glass pipe 220a may be deformed when the circular portion is formed. For the reason, there is such a fear that the accommodated carbon wire heating element 4 may make contact with the inner wall of the quartz glass pipe 220a, which is not preferable. On the other hand, if the curvature radius r exceeds five times the outside diameter of the quartz glass pipe, the width of the heater increases and the radiation in the vertical direction increases, which is not preferable.

The first and second straight portions 221, 223 have a length of four times or more the outside of the quartz glass pipe 220a, in other words, a length of twice or more the length of the top circular portion 222 and the bottom circular portion 224.

Because the first and second straight portions 221, 223 have a length of twice or more the length of the top circular portion 222 and the bottom circular portion 224, radiation heat in the direction of the vertical plane (lateral direction) can be made larger than the radiation heat in the vertical direction.

An interval T (see FIG. 10) between the quartz glass pipes 220a at the top circular portion 222 and the bottom circular portion 224 can be selected appropriately and as this interval is smaller, the radiation heat in the direction of the vertical plane (lateral direction) can be increased.

However, because the heater portion 220 is formed by winding the quartz glass pipe 220a spirally in the vertical direction, the straight quartz glass pipes 220a (221, 223) are disposed before and after in the radiating direction. Therefore, if the quartz glass pipe is wound too densely, radiation heat from the straight quartz glass pipe 220a (221) disposed after cannot be used effectively, so that the inside of the wound quartz glass pipe 220a is heated abnormally.

Thus, preferably, the circular quartz glass pipe 220a (222, 224) is wound with at least a gap of one to three times the outside diameter of the quartz glass pipe 220a with respect to an adjacent circular quartz glass pipe.

The heater holding portion 240 includes a heater top holding pipe 241 provided in contact with the inside of the circular quartz glass pipe 220a (222) formed on the top, a heater bottom holding pipe 242 provided in contact with the outside of the circular quartz glass pipe 220a (224) formed on the bottom and linking members 243 for linking the heater top holding pipe 241 with the heater bottom holding pipe 242.

Then, the top circular quartz glass pipe 220a (222) and the heater top holding pipe 241 are welded together. The bottom circular quartz glass pipe 220a (224) and the heater bottom holding pipe 242 are welded together. Further, the linking member 243 is welded with the heater top holding pipe 241 and the heater bottom holding pipe 242.

Thus, the heater holding portion 240 is integrated with the heater portion 220. Provision of such a heater holding portion 240 increases mechanical strength of the heater portion 220 thereby protecting from a damage. Further, provision of the heater bottom holding pipe 242 improves installation performance. Further, heat capacity of the circular portion where the heater holding portion 240 is attached to the circularly formed quartz glass pipe 220a (222, 224) increases, thereby decreasing the radiation on the side of the inner peripheral portion further.

Figure 12C:
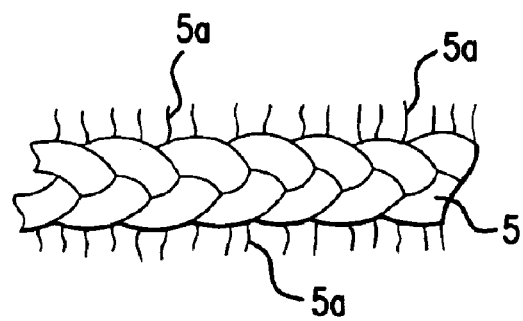
FIG. 12C is a schematic diagram of the carbon wire (heating element)

FIG. 12C depicts the carbon wire heating element 5 having carbon fiber fuzz 5a on its surface. The carbon fiber fuzz 5a refers to protrusion of a cut portion or part of the carbon fiber (single-fibers) from an outer surface of the carbon wire.

Next, the structure of the sealing terminal portion 230 will be described with reference to FIGS. 11, 13A, 13B and 14. This sealing terminal portion 230 contains a connecting line 31 and a single heater portion 220 requires two sealing terminal portions 30 as shown in FIG. 10. Because these sealing terminal portions 230 have the same structure, one sealing terminal portion 230 will be described.

This sealing terminal portion 230 includes a glass pipe 231 composing the sealing terminal portion, a straight pipe 232 accommodated inside the glass pipe 231, plural the wire carbon materials 33 accommodated in the straight pipe 32 in a compressed state, a sealing glass pipe 235 for sealing an end portion of the glass pipe 231 and the connecting wire 31 made of tungsten provided on the sealing glass pipe 235.

The carbon wire heating element 4 introduced from the introduction portion of the quartz glass pipe 200a has the same structure as the carbon wire heating elements of the first embodiment and second embodiment. The carbon wire heating element 4 is connected by a structure in which it is nipped by plural the wire carbon materials 33 accommodated in the straight pipe 232 within the glass pipe 231 in a compressed state and the connecting wire 31 of the sealing terminal portion 230 is connected to the wire carbon materials 33.

The sealing glass pipe 235 is constituted of, from a fusion side with the glass pipe 231, the quartz glass portion 235a, a graded sealing portion 235b and tungsten (W) glass portion 235c.

Figure 14:
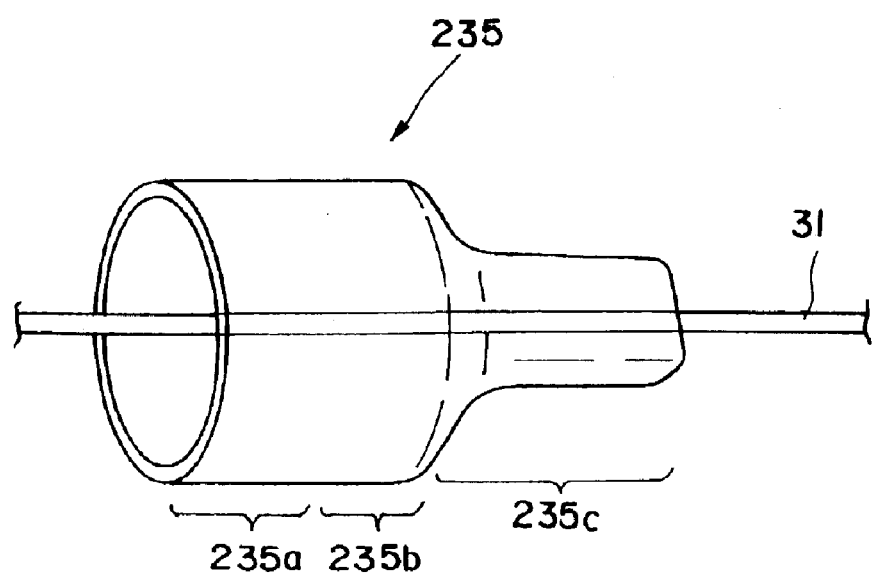
FIG. 14 is a perspective view showing the sealing pipe constituting the sealing terminal portion.

As shown in FIG. 14, the connecting wire 234 made of tungsten (W) connected to the carbon wire accommodated within the straight pipe 232 in a compressed state is pinch-sealed by the pinch sealing portion 235c of the tungsten (W) glass portion 235c.

The pinch-sealing portion 235d is formed of tungsten (W) having a thermal expansion coefficient near the tungsten (W) constituting the connecting wire and the fusion side of the glass pipe 231 is formed of quartz glass.

Because the pinch-sealing portion 235d is formed of tungsten (W) glass having a thermal expansion coefficient near tungsten (W) constituting the connecting wire 234, the glass portion (pinch-sealing portion 235d) can be prevented from being damaged with thermal expansion when the connecting wire 234 is at high temperatures.

Further, because the sealing glass pipe 235 (quartz glass pipe 235a) to be fused with the glass pipe 231 is made of the same quartz glass as the glass pipe 231, it can be prevented from being damaged with thermal expansion. Further, using high purity quartz glass enables to protect from metallic pollution.

Further, the graded sealing portion 235b is formed between the quartz glass portion 235a and the tungsten (W) glass portion 235c.

The side in contact with the quartz glass portion 235a in which its $SiO_2$ component and W glass component change gradually is composed of quartz glass component or material having a similar thermal expansion coefficient thereto, this material being oriented so as to adjoin the W glass portion 235b. Then, the graded sealing portion 235b, whose thermal expansion coefficient is distributed with a gradient so as to make its thermal expansion coefficient approximate that of the W glass, is provided between the quartz glass portion 235a and the tungsten (W) glass portion 235c, thereby preventing the glass pipe 235 from being damaged due to thermal expansion at high temperatures.

Figure 13A:
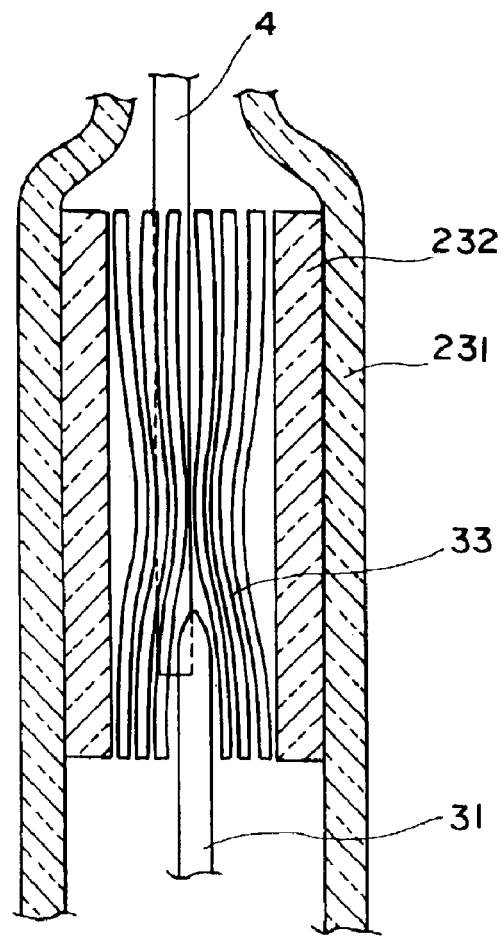
FIG. 13A is a longitudinally sectional view showing an internal structure of the sealing end portion of FIG. 10.
Figure 13B:
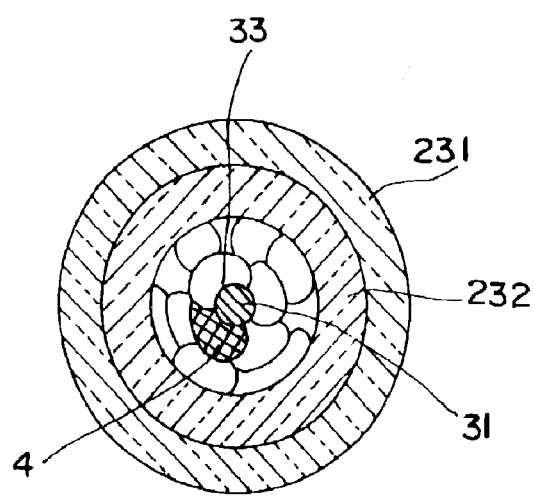
FIG. 13B is a laterally sectional view showing an internal structure of the sealing end portion of FIG. 10.

As shown in FIGS. 13A and 13B, in the sealing terminal portion 230, the carbon wire heating element 4 is nipped by the plural the wire carbon materials 33 in a compressed state and electrically connected to the connecting wire 31 through the plural the wire carbon materials 33.

Because the carbon wire heating element 4 is not connected directly to the connecting wire but through the plural the wire carbon materials 33 accommodated in a compressed state, connection between the wire carbon material 33 and the carbon wire heating element 4 is never made loose even if the heating element reaches a high temperature. Further, because the temperature drops sufficiently within the wire carbon materials 33, the connection with the connecting wire is not made loose thereby excellent electric connection being maintained.

Additionally, carbon components in the plural the wire carbon materials 33 exert reduction action so as to suppress increase of oxidation on the conductive wires and consequently, generation of a spark can be prevented.

When the carbon wire heating element 4 is sealed within the quartz glass member, the quantity of water absorbed in the carbon wire heating element 4 is preferred to be $2 \times 10^{-3}$ g or less per 1 $cm^3$ of said carbon wire heating element. Consequently, generation of the black spot is blocked, so that a carbon wire heating element sealing heater having an excellent heat generation characteristic can be obtained.

According to the third embodiment of the present invention, the sealing terminal portion 230 (particularly, internal structure of the straight pipe 232) is preferred to adopt any structure of the terminal portions of the second embodiment. As a result, there is provided a carbon wire heating element sealing heater in which contact between the carbon wire heating element and the glass pipe is blocked and breaking of the carbon wire heating element is inhibited.

The manufacturing method for the third embodiment will be described with reference to FIGS. 10 and 11.

(1) The introduction portion 225, the first straight portion 221, the top-circular portion 222, the second straight portion 23 and the bottom circular portion 24 are formed and the quartz glass pipe 220a is wound spirally. After that, the quartz glass pipe 31 having a diameter larger than the quartz glass pipe 220a is fused to the introduction portion 225.

(2) The carbon wire heating element 4 is passed between the quartz glass pipes 231 provided on both ends of the quartz glass pipe 220a.

(3) Next, the carbon wire heating element 4 is inserted into the straight pipe 232 and the wire carbon members 33 are accommodated in the straight pipe 232 in a condition that their insertion sides are in a U shape. At this time, an introduction string is passed through the U-shaped portion on the wire carbon member insertion side and by pulling that introduction string, the wire carbon members 33 can be accommodated within the straight pipe 232 in a compressed state. Consequently, the carbon wire heating element is fixed firmly. Then, the wire carbon member and carbon wire heating element protruding from a distal portion are cut off.

(4) Then, the straight pipe 232 in which the wire carbon members 33 and the carbon wire heating element 4 are accommodated in a compressed state is inserted into the quartz glass pipe 231.

(5) Next, the connecting terminal 31 of the sealing glass pipe 235 is inserted so as to connect electrically the carbon wire heating element 4 with the connecting terminal 31.

(6) Next, the quartz glass pipe 231 and the sealing glass pipe 235 are fused together while introducing inactive gas, for example, nitrogen gas from a gas introduction port (not shown) so as to form the sealing terminal portion 230. In the meantime, the nitrogen gas protects the carbon wire heating element 4 and the wire carbon members 33 from being deteriorated by heating.

(7) After the other sealing terminal portion 3 is formed, the inside of the quartz glass pipe 220a is depressurized to 100 torr or less and after that, by sealing the gas introduction port with an oxyhydrogen burner, a heater is completed (FIG. 10).

The above-described manufacturing method enables a heater of this embodiment to be manufactured easily.

Next, a modification of the third embodiment will be described with reference to FIGS. 15 to 18. Like reference numerals are attached to the same components or similar components to the members shown in FIGS. 10 to 14 and a detailed description thereof is omitted.

This embodiment has a feature in prevention of damage on the circular quartz glass pipe 222 formed on the top and prevention of damage on a portion B for connecting the sealing terminal portion 230 with the quartz glass pipe 221.

Figure 15:
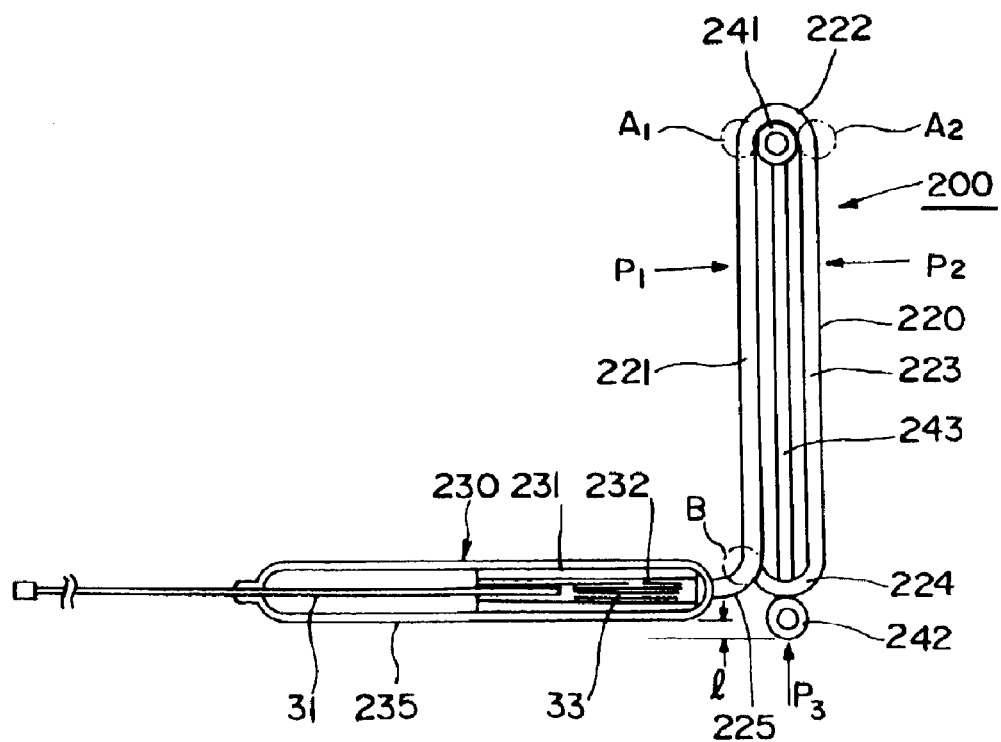
FIG. 15 is a side view for explaining a subject of the third embodiment.

If an unexpected external force as indicated by arrows P1, P2 due to vibration from the earthquake or the like or a worker is applied to the quartz glass pipes 220, 221 as shown in FIG. 15, stress is concentrated on A1, A2 of the quartz glass pipes 220, 221 so that they may be damaged. If as shown in FIG. 15, the bottom face of the heater bottom holding pipe 242 is located below the bottom face of the sealing glass pipe 235 of the sealing terminal portion 230 (protruded by the length l), if a heater 200 is provided, the bottom face of the heater bottom holding pipe 242 makes contact with the ground.

If an external force P3 is applied to a portion B which combines the sealing terminal portion 230 with the quartz glass pipe 221, that portion B may be damaged by vibration or the like.

Figure 16:
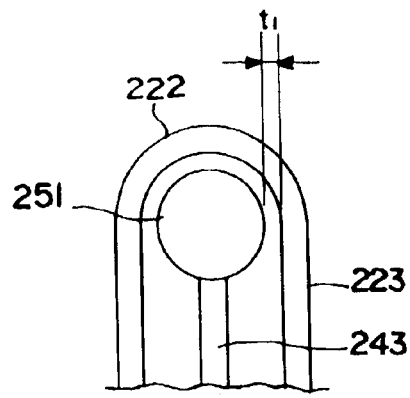
FIG. 16 is a major portion enlargement diagram for explaining a modification of the third embodiment.

According to this modification, a portion likely to be damaged by such an external force as vibration is improved. As shown in FIG. 16, a hallow heater top holding rod-like body 251 is provided with a predetermined gap $t_1$ on an inner side of the circular quartz glass pipe 222 formed on the top.

Figure 17:
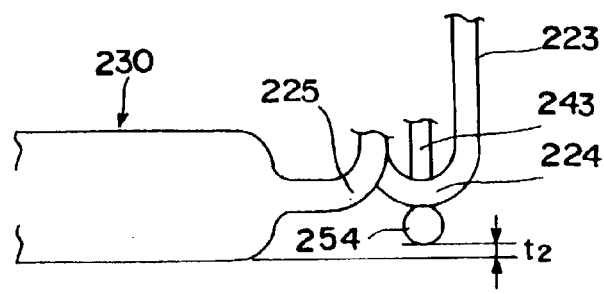
FIG. 17 is a major portion enlargement diagram for explaining the modification of the third embodiment.

Further, as shown in FIG. 17, the bottom face of the hallow heater bottom holding rod-like body 254 is located a predetermined distance $t_2$ above the bottom face of the sealing terminal portion 230.

Figure 18:
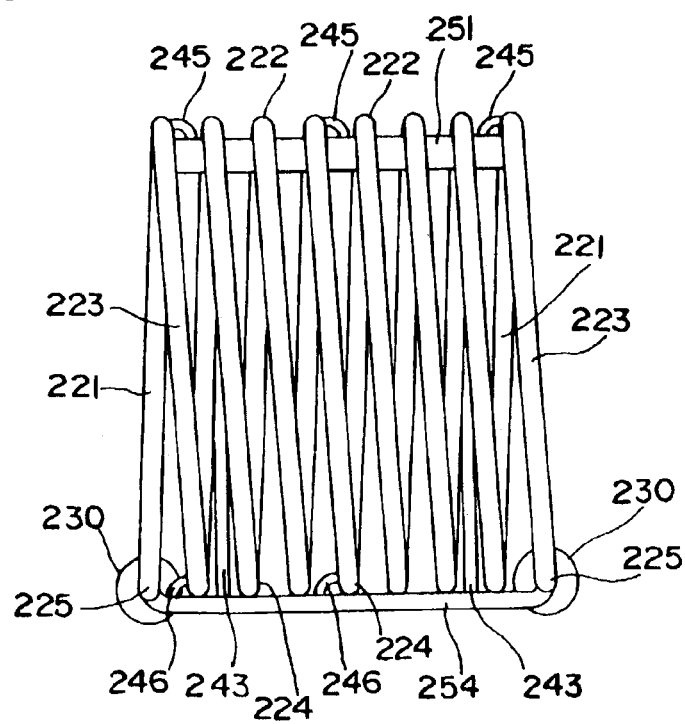
FIG. 18 is a front view for explaining the modification of the third embodiment.

Different from the above-described embodiment, as shown in FIG. 18, the heater top holding rod-like body 251 is fixed by the circular quartz glass pipe 222 formed on the top and the small-diameter, hallow circular quartz glass rod 245. Likewise, the heater bottom holding rod-like body 254 is fixed by the circular quartz glass pipe 224 formed on the bottom and the small-diameter, hallow circular quartz glass rod 246.

Because the predetermined gap $t_1$ exists between the inner side of the circular quartz glass pipe 222 formed on the top and the heater top holding rod-like body 251, a collision between the quartz glass pipe 222 and the heater top holding rod-like body 251 can be avoided thereby preventing a damage. Particularly, a collision between a connecting portion of the quartz glass pipe 222 and the second straight portion 223 and the heater top holding rod-like body 251 can be avoided. This gap $t_1$ is preferred to be 0.2 mm or more from viewpoint of avoiding such a collision.

Because the bottom face of the heater bottom holding rod-like body 254 is located the predetermined distance $t_2$ above the bottom face of the sealing terminal portion 230, even if a heater is placed on a horizontal plane, the bottom face of the heater bottom holding rod-like body 254 never makes contact with an installation face.

Thus, even if vertical vibration is applied due to the earthquake or the like, the bottom face of the heater bottom holding rod-like body 254 never makes contact with the installation face, thereby protecting the portion B (introduction portion 225) which connects the sealing terminal portion 230 with the quartz glass pipe 224 from a damage.

Meanwhile, the predetermined distance $t_2$ is preferred to be 0.5 mm or more. The reason is that if there is a difference in height of 0.5 mm or more, the bottom face of the heater bottom holding rod-like body 254 never makes contact with the installation face even if the vertical vibration is applied due to the earthquake or the like.

Further, the heater top holding rod-like body 251 is fixed with the circular quartz glass pipe 222 formed on the top and the small-diameter hallow circular quartz glass rod 245 and the heater bottom holding rod-like body 254 is fixed with the circular quartz glass pipe formed on the bottom and the small-diameter hallow circular quartz glass rod 246.

Thus, the heater portion 220 can be maintained and even if a large external force is applied, the hallow circular quartz glass rods 245, 246 are damaged so as to avoid a damage in the heater portion 220.

In the meantime, when the carbon wire heating element 4 is sealed in the quartz glass member, the quantity of water absorbed therein is preferred to be less than $2 \times 10^{-3}$ g per 1 cm$^3$ of said carbon wire heating element. Consequently, generation of the black spot during usage is suppressed, so that a carbon wire heating element sealing heater having an excellent heat generating characteristic can be obtained.

According to the heater of the third embodiment as described above, there is no diffusion of pollutant substance, particularly no diffusion of pollutant substance such as impure metal or the like from heating object. Thus, pollution of a processing object is suppressed, so that a heater having directivity of radiation heat and capable of intensifying radiation heat in the direction of a vertical plane can be obtained.

Next, a fluid heating apparatus using the carbon wire heating element sealing heater of the fourth embodiment will be described. A case where gas is used as this fluid will be explained in detail with reference to FIGS. 19 to 24.

Figure 19:
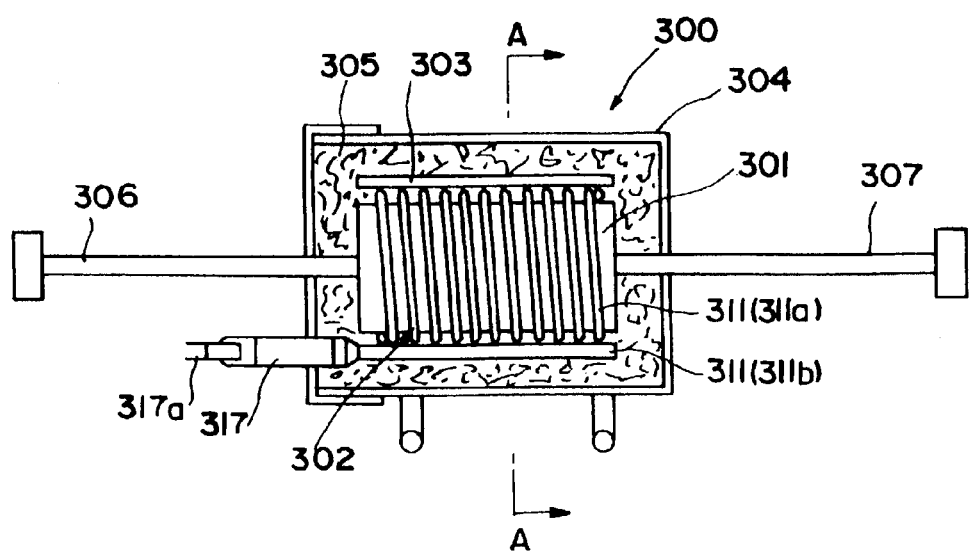
FIG. 19 is a side sectional view showing the fourth embodiment of the present invention for explaining a gas (fluid) heating apparatus employing the carbon wire heating element sealing heater of the present invention.
Figure 20:
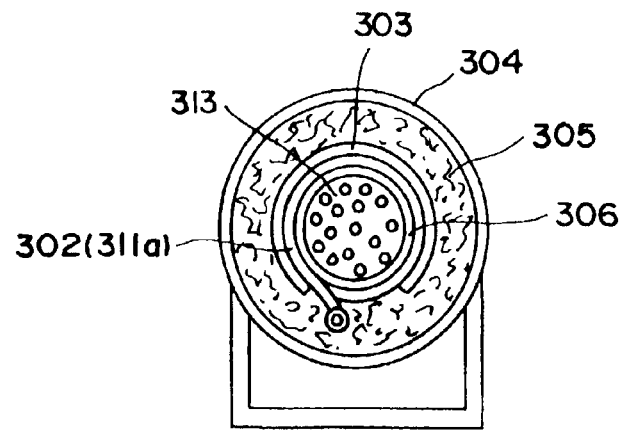
FIG. 20 is a sectional view taken along the line A—A of FIG. 19.

As shown in FIG. 19, a gas heating apparatus 300 of the present invention comprises a heating pipe 301 for heating gas supplied from a gas supply source, a heater portion 302 formed spirally around an outer periphery of the heating pipe 301, heat insulating body 303 made of quartz glass which accommodates the heating pipe 301 and the heater portion 302, a housing 304 accommodating the heat insulating body 303 for accommodating the heating pipe 301 and the heater portion 302 a high purity heat insulating material 305 provided between the heat insulating body 303 and the housing 304, a connecting pipe 306, which is a gas introduction pipe, whose end is connected to a gas supply source while the other end is connected to the heating pipe 301 and a connecting pipe 307, which is a gas introduction pipe, whose end is connected to the heating pipe 301 while the other end is connected to a semiconductor heating processing furnace (not shown).

Figure 21:
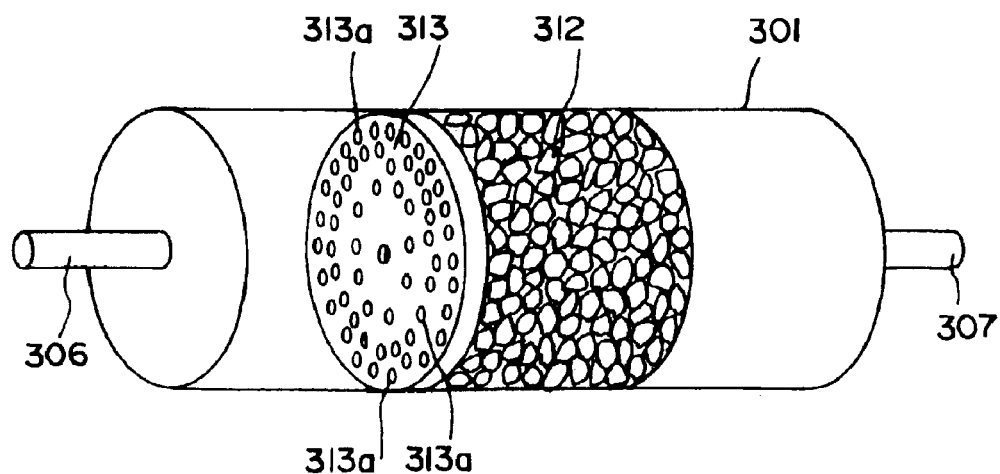
FIG. 21 is a diagram showing filler material and a diffusion plate disposed within the heating pipe.

As shown in FIG. 21, filler material 312, which resists passing gas and a diffusion plate 313 are disposed within the heating pipe 301.

A heat generating portion of the heater portion 302 is constituted of the quartz glass pipe 311 in which the carbon wire heating element 4 (not shown) as a carbon fiber described in the first embodiment is sealed and disposed spirally on the surface of the heating pipe 301.

As shown in FIG. 19, this quartz glass pipe 311 is comprised of a spiral quartz glass pipe 311a, a straight pipe 311b made of quartz glass connected to an end of the spiral quartz glass pipe 311a and for supporting the spiral structure of the quartz glass pipe 311a, and a straight pipe 311c (not shown) connected to the other end of the spiral quartz glass pipe 311a for supporting the spiral structure of the quartz glass pipe 311a.

The spiral quartz glass pipe 311a communicates with the straight pipes 311b, 311c and the carbon wire heating element 4 is accommodated in the spiral quartz glass pipe 311a and introduced from the straight pipes 311b, 311c.

A sealing terminal portion 317 as shown in FIG. 19 is provided on each end portion of the straight pipes 311b, 311c. Like the terminal portion 3 of the first embodiment, this sealing terminal portion 317 has a connecting line 317a for supplying electricity.

As this carbon wire heating element 4, the same one as the carbon wire heating element of the first embodiment is used. The heater portion 302 in which the carbon wire heating element is sealed in its quartz glass pipe 11 has a smaller heat capacity than a conventional high purity silicon carbide heater, so that metallic pollution harmful for semiconductor wafer, generation of particles, generation of impurity gas and the like are suppressed. The quantity of water absorbed therein is $2\times10^{-3}$ g or less per 1 cm$^3$ of said carbon wire heating element and generation of the black spot during usage is suppressed, so that a heat generation characteristic is more excellent.

Usually, the heating pipe 301 is formed in a cylindrical shape of transparent quartz glass about 1 to 3 mm thick. After the filler material 321 and the diffusion plate 313 are accommodated, the heating pipe 301 is closed with side end plates provided with the connecting pipes 306, 307 and sealed firmly.

The sizes (effective diameter, effective length) of the heating pipe 301 are set up appropriately considering the quantity of gas to be heated, heating temperature, gas heat capacity and the like and usually, the effective diameter is 50 to 100 mm while the effective length is 100 to 200 mm.

As the filler material 321 to bed is posed with in the heating pipe 301, a substance by fusing short-column like transparent quartz beads as shown in FIG. 21 together is used.

The shape of the quartz glass bead is not always restricted to a short-column like shape if that shape is capable of absorbing radiation heat and providing passing gas with heat effectively but spherical shape, rotary elliptical shape, short-column cylindrical shape, saddle shape or the like may be adopted. However, any shape which causes distortion upon fusion or likely generates cracks or chipping upon usage is not preferable and the short-column cylindrical shape is preferred because it is as cheap as possible and easy to process and other reasons.

Because heat conductivity of quartzes property of the quartz glass or the like is not so large, most heat energy transmitted from the carbon wire heating element of the heater portion 302 to the interior of the heating pipe 301 through the quartz glass pipe 311 containing the same carbon wire heating element is radiation heat. For the reason, the filler material 321 within the heating pipe 301 is preferred to be transparent body rather than a black body.

The reason is that if the filler material 321 is the black body, radiation heat is absorbed by the surface portion of the black body while only the surface portion is locally heated. If the filler material 321 is transparent body, projected radiation heat reaches a center portion through transmission, reflection and refraction in complicated manner, so as to heat the interior of the filler material 321 equally. Consequently, gas passing through the interior of the heating pipe 301 can be heated equally.

The shape of the transparent quartz glass bead is short-column cylindrical and its size is selected appropriately depending on gas permeability (ventilation resistance pressure loss). Usually, 4 to 15 mm in diameter and 4 to 15 mm in length is used, and more preferably, 6 to 12 mm in diameter and 6 to 12 mm in length is adopted.

Particularly, a substance formed by fusing two kinds of short-column cylindrical quartz glass beads of 6 to 12 mm in diameter and 6 to 12 mm in length and 4 to 10 mm in diameter and 4 to 10 mm in length mixedly at a ratio in quantity of 1:4 or 4:1 (more preferably, 6:4 or 8:2) is unlikely to generate cracks or chipping or acceptable in terms of filling ratio and gas pressure loss.

A disc-like diffusion plate 313 made of quartz glass is formed on a upstream side face of the quartz glass bead formed substance (filler material 321) integrally with the same quartz glass bead formed substance by fusion or the like.

Figure 24:
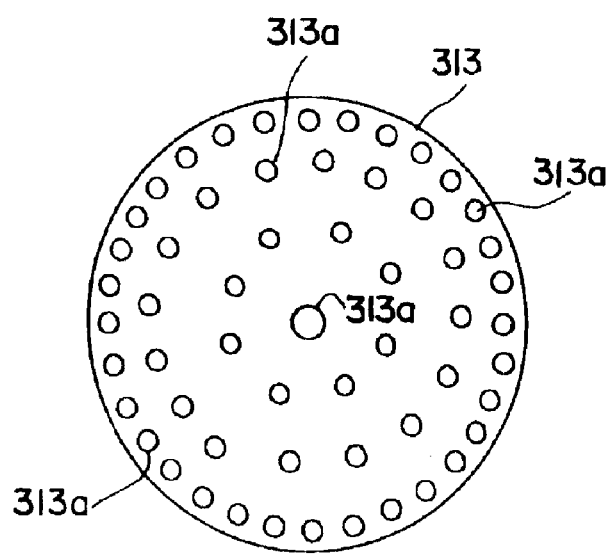
FIG. 24 is a front view of the diffusion plate.

As shown in FIG. 24, this diffusion plate 313 has plural through holes 313a. The quantity of the through holes increases as it goes from the center thereof toward its outer periphery. That is, a rate of openings per unit areas is higher on the outer periphery than on the center portion.

Because the disc-like diffusion plate 313 made of quartz glass is formed on the upstream side face of the quartz glass by fusion with this quartz glass bead formed substance (filler material 321), gas introduced into the interior of the heating pipe 301 is diffused from the center portion toward the outer periphery by the diffusion plate 313, so that it flows from the entire upstream side face of the filler material 321 into the interior.

Particularly because the opening rate per unit area of the outer periphery is formed higher than the central portion, gas introduced into the heating pipe 301 is diffused toward the outer periphery of the heating pipe 301, so that gas flows from the entire upstream side face of the filler material 321. Consequently, gas flows through the entire region of the filler material 321.

Therefore, because gas flows through the entire region of the filler material 321, heat conversion efficiency is improved and gas residence is further improved.

Because the diffusion plate 313 is formed integrally on the upstream side face of the filler material 321 by fusion or the like, the filler material 321 is not partially (quartz glass bead) separated, thereby preventing generation of particles or the like.

As means for allowing gas to flow from the entire surface on the upstream side of the filler material 321, it is permissible to form the outside diameter of the diffusion plate 313 smaller than the inside diameter of the heating pipe 301 so as to form a gap between the both with a structure that the diffusion plate 313 is not fused with the heating pipe 301. Such a structure enables to protect the heating pipe 301 from being deformed upon production, thereby improving dimensional stability.

If a diffusion plate 313 having a structure containing the gap between the outer peripheral face of the diffusion plate 313 and the inner peripheral face of the heating pipe is exemplified, if the inside diameter of the heating pipe 301 is 56 mm, the length thereof is 205 mm and the thickness thereof is 3 mm, a diffusion plate 313 in which the outside diameter thereof is 53 mm, the thickness is 3 mm and 37 through holes each having the diameter of 3 mm exist can be used.

To ensure a structure in which the outer peripheral face of the diffusion plate 313 and the inner peripheral face of the heating pipe 301 are brought into a firm contact or fused, the inside diameter of the heating pipe 301 is formed to be substantially the same as the outside diameter of the diffusion plate 313.

To improve heat efficiency of the heater portion 302 by reflecting heat rays radiated from the heater portion 302 outward, the heat insulating body 303 covers the heating pipe 301 and the heater portion 302. Then, the heat insulating body 303 is disposed within the housing 304.

Preferably, a high purity heat insulating material 305 such as glass wool is loaded in a space between the heat insulating body 303 and the housing 304 or in a gap between the heat insulating body 303 and the heater portion 303.

Although the housing 304 for accommodating the heat insulating body 303 internally so as to form the outer shape of the gas heating apparatus 300 is preferred to be structured with quartz glass material, the material for use is not restricted to the quartz glass material, but for example, a metallic case may be used. This housing 304 is cylindrical and closed after the heating pipe 301, the heater portion 302 and the heat insulating plate 303 are accommodated. The side end face of the housing 304 has openings for introducing out the connecting pipes 306, 307 and the sealing terminal portion 317 of the heater portion 302.

According to the third embodiment, preferably, the sealing terminal portion 317 adopts any structure of the terminal portions of the second embodiment. Consequently, a contact between the carbon wire heating element and the glass pipe is prevented, so that a carbon wire heating element sealing heater in which breaking of the carbon wire heating element is suppressed can be obtained.

Next, a method for manufacturing a formed body (filler material 321) and the diffusion plate 313 with the quartz glass beads will be described.

First, two kinds of quartz glass beads produced by cutting a transparent quartz glass material rod of 6 to 12 mm in diameter to 6 to 12 mm are mixed at a ratio of for example, 7 (larger bead): 3 (smaller bead) so as to produced usually, 600 to 1,000 pieces. Additionally, the diffusion plate 313 is produced from quartz glass plate and the through holes are made at predetermined positions in a predetermined quantity.

Figure 23:
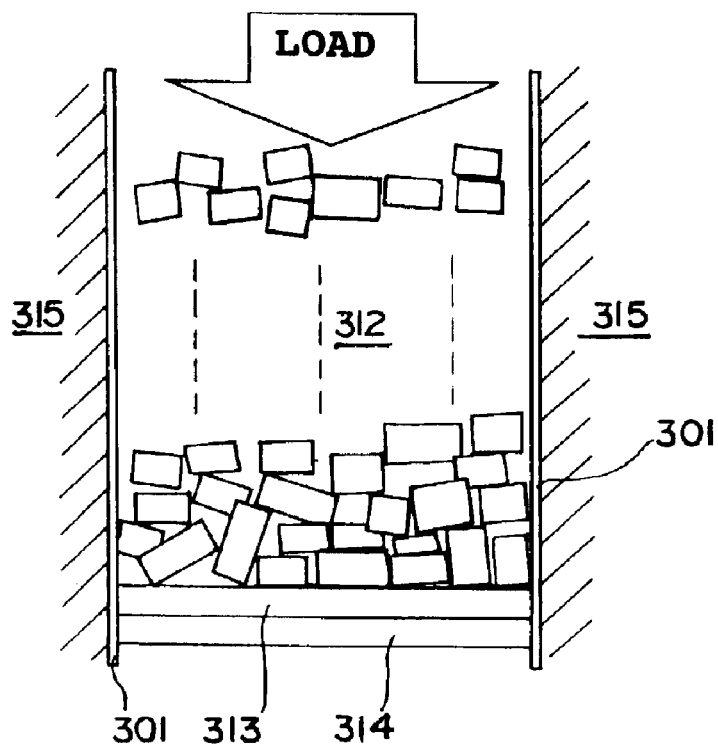
FIG. 23 is a diagram showing manufacturing process for the filler material and diffusion plate.

Then, as shown in FIG. 23, a carbon jig 314 is placed in a quartz cylinder (heating pipe 301) and the diffusion plate 313 is mounted thereon. Further, the quartz glass beads are poured onto this diffusion plate 313.

After that, this quartz cylinder (heating pipe 301) is applied into a cylindrical split mold 315 made of carbon and by heating at higher 1450° C. while pressing with a carbon weight, the quartz glass beads are fused partially with each other so as to produce a cylindrical formed body. At the same time, the diffusion plate 313 is fused with the cylindrical formed body so that they are integrated. At this time, the cylindrical formed body is fused with the quartz cylinder (heating pipe 301) so that they are integrated.

Although upon manufacturing, a load applied to the top like conventionally is not applied to quartz glass beads in the vicinity of the diffusion plate 313, but the quartz glass beads are fused with the diffusion plate 313 by their own weight. As a result, separation of the quartz glass beads can be blocked thereby generation of particles and the like being suppressed.

Because the filler material 321 produced in such a way is disposed in the heating pipe 301, gas introduced into the heating pipe 301 passes through fine passages bent and intersecting in complicated way, constituted of the filler material 321, so as to provide with suitable resident time. Radiation heat from the heater portion repeats transmission, refraction, scattering and reflection in complicated way inside the filler material 321.

As a result, the introduced gas can be supplied with a sufficient heat amount. Thus, heat exchange efficiency excels so that the sizes of the heating pipe and heater portion can be reduced.

Figure 22:
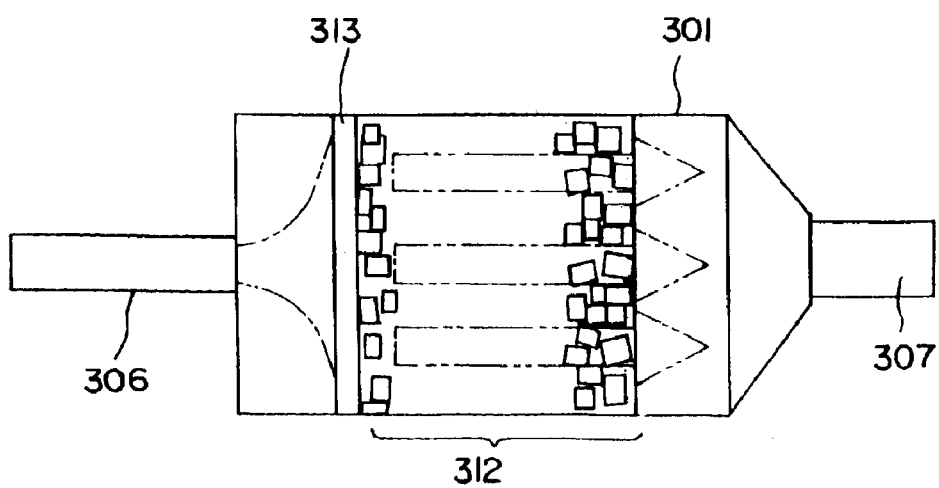
FIG. 22 is a diagram showing schematically gas (fluid) flow.

Because the diffusion plate 313 is formed integrally on the upstream side face of the filler material 321, gas introduced into inside of the heating pipe 301 is diffused by the diffusion plate 313 as shown in FIG. 22, so that gas flows in from the entire upstream side face of the filler material 321.

Consequently, gas flows through the entire region of the filler material 321, so that gas residence is improved and heat exchange efficiency is improved. Further, the filler material 321 is never partially separated and generation of particles therewith can be prevented. A two-dot chain line in FIG. 22 indicates gas flow.

Next, a modification of this embodiment will be described with reference to FIGS. 25, 26.

Although according to the previous embodiment, the diffusion plate 313 is formed on the upstream face of the filler material 321, according to this embodiment, the diffusion plates 313, 316 are formed on the upstream face and downstream face of the filler material (cylindrical formed body) 321.

The diffusion plate 313 provided on this upstream face has the same structure as the diffusion plate of the previous embodiment. Although the diffusion plate 316 basically has the same structure as the diffusion plate of the previous embodiment, the outside diameter of the diffusion plate 316 is formed to be smaller than the inside diameter of the heating pipe 301. Further, like the diffusion plate 316, the diffusion plate 313 to be provided on the upstream face may be formed to have a outside diameter smaller than the inside diameter of the heating pipe 301.

Figure 25:
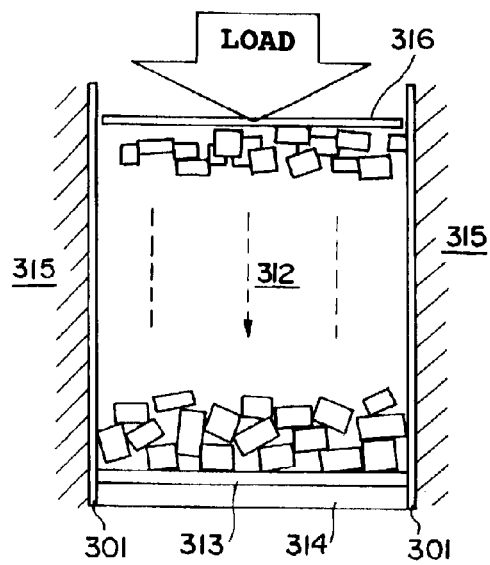
FIG. 25 is a diagram showing manufacturing process of the filler material and diffusion plate according to a modification of the gas (fluid) heating apparatus.

When producing the formed bodies and the diffusion plates 313, 316 using such quartz glass beads, the quartz glass bead and the first, second diffusion plates 313, 316 are manufactured like the previous embodiment and as shown in FIG. 25, the carbon jig 314 is placed in the quartz cylinder (heating pipe 301) and the diffusion plate 313 is mounted thereon. Further, the quartz glass bead and the second diffusion plate 316 are placed on this diffusion plate 313.

After, this quartz cylinder (heating pipe 301) is applied into the carbon made cylindrical split mold 315, a carbon weight is placed thereon and heated at 1450° C. or higher so as to fuse the quartz glass beads partially together to a cylindrical formed body.

At the same time, the first, second diffusion plates 313, 316 are fused with the cylindrical formed body so that they are integrated. Further, the cylindrical formed body 321 a is fused with the quartz pipe (heating pipe 301) so that they are integrated.

If the outside diameter of the first diffusion plate 313 is formed to be smaller than the inside diameter of the heating pipe 301, a gap is formed between the both. If the outside diameter of the first diffusion plate 313 is equal to the inside diameter of the heating pipe 301, both of them are fused together so that they are integrated.

On the other hand, because the second diffusion plate 316 is formed to be smaller than the inside diameter of the heating pipe 301, both of them are not fused or integrated. That is, because a load is applied to the quartz glass beads by pressing the second diffusion plate 316, the quartz glass beads are deformed so that the second diffusion plate 316 sinks. Thus, if the second diffusion plate 316 is formed to be equal to the inside diameter of the heating pipe 301 and both of them are fused together, not only the second diffusion plate 316 but also the heating pipe 301 are deformed, lacking dimensional stability, which is not preferable.

Because a sufficient force is applied to the quartz glass beads located above by a weight from above, fusion portions (neck portions) of the quartz glass beads are large.

Because the weight is distributed as it goes from up to down so that the force applied to the quartz glass beads downward becomes smaller, the fusion portion of the quartz glass beads is smaller than the fusion portion (neck portion) of the quartz glass beads located upward.

The reason is that if the neck portion is larger, the gap between the quartz glass beads is smaller and if the neck portion is smaller, the gap between the quartz glass beads is larger.

Therefore, porosity on the upper side of the formed body formed by fusing the quartz beads together is formed to be smaller than the porosity on the lower side. In the meantime, the upper side of this formed body responds to the downstream side of the heating pipe while the lower side responds to the upstream side of the heating pipe.

Here, the sizes of the fusion portion (neck portion) of the quartz glass beads were measured. Upon the measurement, a formed body was dipped in hydrogen fluoride solution and a time until the quartz glass beads dropped was measured and the size of the neck portion was calculated from that measured time.

More specifically, because the quartz glass was etched in HF solution having 16% density at a velocity of 8 $\mu$m/h, a time until the quartz glass beads dropped was measured and by multiplying this time by that etching velocity and a constant (the constant is 2 because the etching is progressed from both sides of the neck portion), a quantity (size of the neck portion) of an etched portion was obtained.

Figure 26:
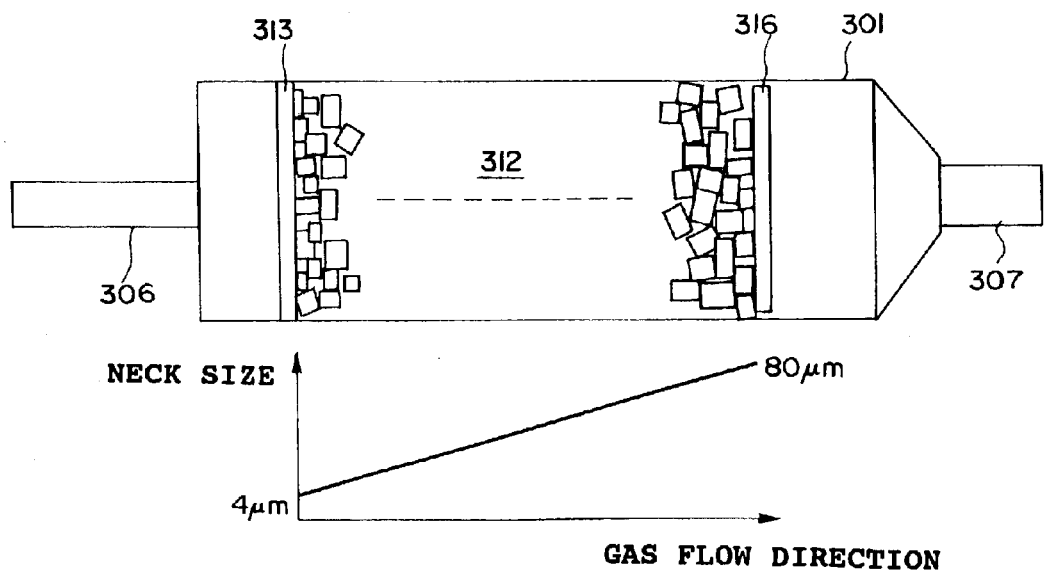
FIG. 26 is a sectional view showing a modification of the gas (fluid) heating apparatus and a diagram showing changes of the neck portion.
Figure 27A:
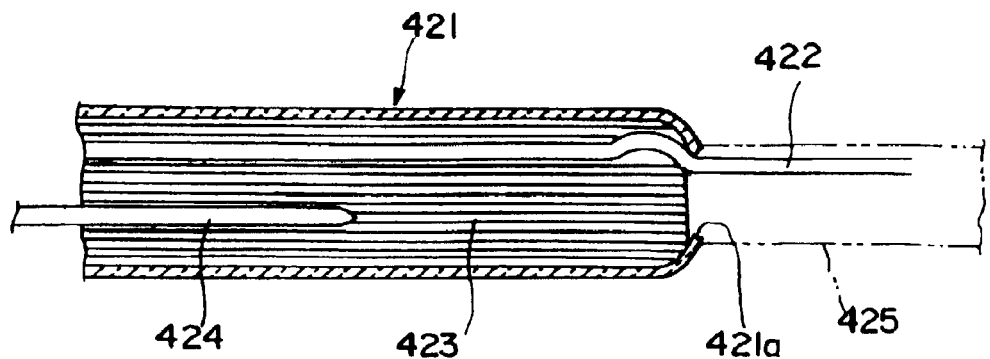
FIG. 27A is a sectional view showing the terminal portion of a conventional heater or a sectional view in parallel to the axis of the glass pipe.
Figure 27B:
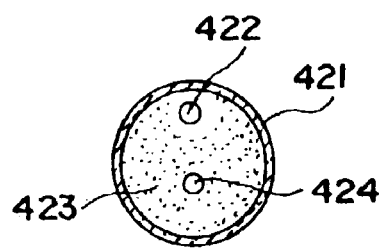
FIG. 27B is a sectional view taken along the line I—I of FIG. 27A.
Figure 28:
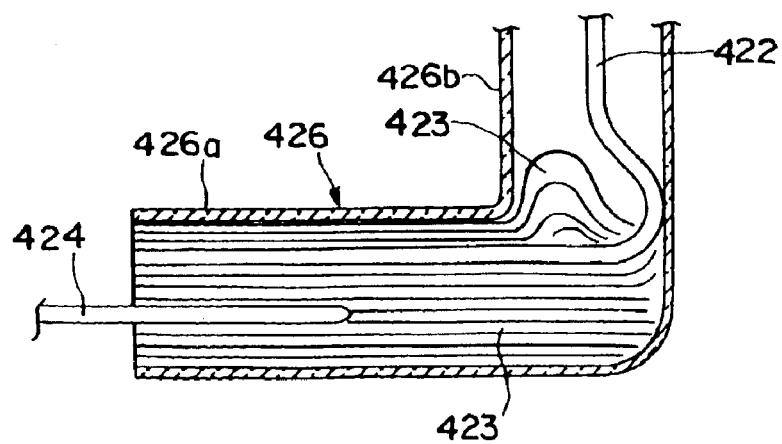
FIG. 28 is a sectional view showing conventional other terminal portion.
Figure 29A:
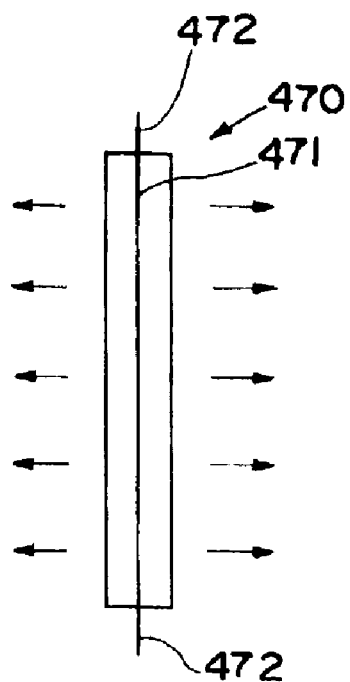
FIG. 29A is a schematic diagram showing a conventional heater, which is a rod-like heater.
Figure 29B:
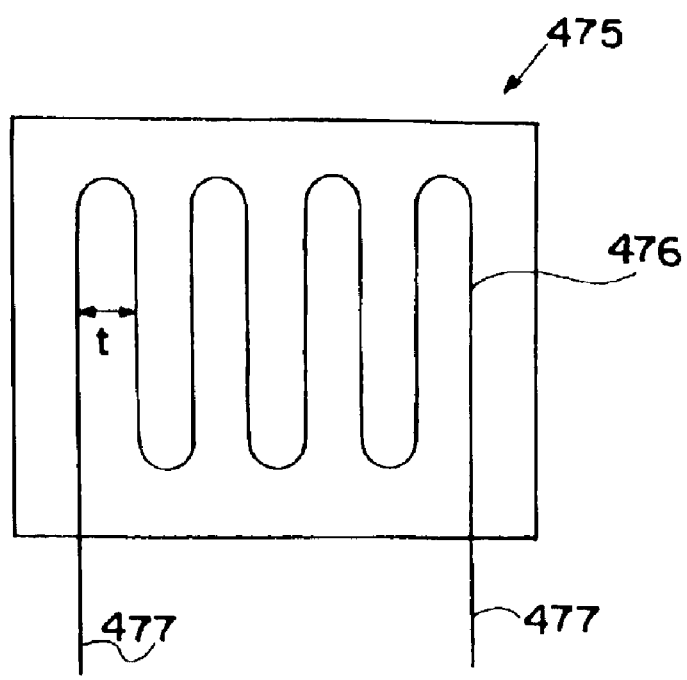
FIG. 29B is a schematic diagram of a conventional heater, which is a sheet-like heater.

Consequently, as shown in FIG. 26, that quantity was 80 $\mu$m on the downstream side while it was 4 $\mu$m on the upstream side. As evident from this, it was verified that the porosity on the upstream side was large while the porosity on the downstream side was small.

Because the porosity in the formed body on the downstream side formed by fusing the quartz glass beads together is smaller than the porosity on the upstream side, gas residence can be improved thereby leading to improvement of heat exchange efficiency.

Because the diffusion plates are formed integrally on the upstream and downstream sides of the filler material, the filler material is not partially separated thereby preventing particles and the like from being generated thereby.

Although an example in which gas is employed as fluid by a fluid heating apparatus using the carbon wire heating element sealing heater of the present invention has described above, even if liquid such as pure water is used instead of gas, the same operation and effect can be obtained.

As described, this embodiment enables to obtain a fluid heating apparatus employing the carbon wire heating element sealing heater which can be reduced in size, having excellent gas residence and heat exchange efficiency and capable of suppressing generation of particles and the like.

What is claimed is:

1. A carbon wire heating element sealing heater in which a carbon wire heating element using carbon fibers is sealed in a quartz glass member, wherein the quantity of water absorbed in the carbon wire heating element is $2\times10^{-3}$ g or less per 1 cm$^3$ of said carbon wire heating element further comprising:

a first glass pipe disposed at an end portion of the quartz glass member and for accommodating a part of the carbon wire heating element;

a second glass pipe having the same axis as that of the first glass pipe and for accommodating an end portion of a power supply connecting wire for supplying electric power to the carbon wire heating element and an end portion of the carbon wire heating element; and a terminal portion accommodated in the first and second glass pipes in a compressed state and having a wire carbon member for nipping the carbon wire heating element and power supply connecting wire, wherein the wire carbon member is constituted of plural wire carbon bundles composed of wire carbon materials and the carbon wire heating element is disposed substantially in the center of the glass pipe among the plural wire carbon bundles wherein the quantity of the wire carbon members accommodated in the second glass pipe is larger than that of the wire carbon members accommodated in the first glass pipe.

2. A carbon wire heating element sealing heater in which a carbon wire heating element using carbon fibers is sealed in a quartz glass member, wherein the quantity of water absorbed in the carbon wire heating element is $2\times10^{-3}$ g or less per 1 cm$^3$ of said carbon wire heating element further comprising:

a first glass pipe disposed at an end portion of the quartz glass member and for accommodating a part of the carbon wire heating element;

a second glass pipe having the same axis as that of the first glass pipe and for accommodating an end portion of a power supply connecting wire for supplying electric power to the carbon wire heating element and an end portion of the carbon wire heating element; and a terminal portion accommodated in the first and second glass pipes in a compressed state and having a wire carbon member for nipping the carbon wire heating element and power supply connecting wire, wherein the wire carbon member is constituted of plural wire carbon bundles composed of wire carbon materials and the carbon wire heating element is disposed substantially in the center of the glass pipe among the plural wire carbon bundles wherein the wire carbon bundles are accommodated in the glass pipe such that folded-back portions of the wire carbon bundles are located on an introduction side of the carbon wire heating element in the glass pipe for accommodating the end portion of the carbon wire heating element.

3. A carbon wire heating element sealing heater in which a carbon wire heating element using carbon fibers is sealed in a quartz glass member, wherein the quantity of water absorbed in the carbon wire heating element is $2\times10^{-3}$ g or less per 1 cm$^3$ of said carbon wire heating element further comprising:

a first glass pipe disposed at an end portion of the quartz glass member and for accommodating a part of the carbon wire heating element;

a second glass pipe having the same axis as that of the first glass pipe and for accommodating an end portion of a power supply connecting wire for supplying electric power to the carbon wire heating element and an end portion of the carbon wire heating element; and a terminal portion accommodated in the first and second glass pipes in a compressed state and having a wire carbon member for nipping the carbon wire heating element and power supplying connecting wire, wherein the wire carbon member is constituted of plural wire carbon bundles composed of wire carbon materials and the carbon wire heating element is disposed substantially in the center of the glass pipe among the plural wire carbon bundles wherein the first glass pipe for accommodating a part of the carbon wire heating element is formed linearly while the second glass pipe for accommodating end portions of the power supply connecting wire for supplying electric power to the carbon wire heating element and the carbon wire heating element is formed linearly, the carbon wire heating element and the wire carbon bundles are disposed substantially in parallel to axes of the first and second glass pipes, and the carbon wire heating element is introduced from an end portion of the first glass pipe.

4. A carbon wire heating element sealing heater in which a carbon wire heating element using carbon fibers is sealed in a quartz glass member, wherein the quantity of water absorbed in the carbon wire heating element is $2 \times 10^{-3}$ g or less per 1 cm$^3$ of said carbon wire heating element, the carbon wire heating element sealing heater further comprising:

a glass pipe disposed at an end portion of the quartz glass member and for accommodating the end portion of the carbon wire heating element;

a wire carbon member for nipping an end portion of the carbon wire heating element; and a terminal portion whose end is accommodated in the glass pipe and which contains a connecting wire for power supply nipped by compressed wire carbon members, wherein the wire carbon member is constituted of plural wire carbon bundles composed of wire carbon materials, and the carbon wire heating element is disposed substantially in the center of the glass pipe among the plural wire carbon bundles, wherein a glass pipe for accommodating the carbon wire heating element is formed in a T shape while an end thereof is sealed, the carbon wire heating element and the carbon wire bundles are disposed substantially in parallel to the axes from an opening end portion of the glass pipe to a sealing end portion thereof, and the carbon wire heating element is introduced from among the wire carbon bundles at a bent portion of the glass pipe.

5. A carbon wire heating element sealing heater in which a carbon wire heating element using carbon fibers is sealed in a quartz glass member, wherein the quantity of water absorbed in the carbon wire heating element is $2 \times 10^{-3}$ g or less per 1 cm$^3$ of said carbon wire heating element, the carbon wire-heating element sealing heater further comprising:

a heater portion made of quartz glass pipe for accommodating a carbon wire heating element composed of carbon fibers, sealing terminal portions provided on both ends of the quartz glass pipe of the heater portion and a connecting terminal provided on the sealing terminal portion, wherein the heater portion is formed by winding the quartz glass pipe spirally vertically while the quartz glass pipe extending vertically is formed linearly and the quartz glass pipes on the top and bottom portions are formed circularly, and the sealing terminal portions are formed at end portions of the quartz glass pipes of the heater portion extended to sides of the same faces.

6. The carbon wire heating element sealing heater according to claim 5, wherein the curvature radius of the quartz glass pipe formed circularly is twice or more to five times or less the outside diameter of the quartz glass pipe.

7. The carbon wire heating element sealing heater according to claim 7, wherein the ratio between the thickness of the heater portion formed circularly of the quartz glass on the side of an outer peripheral portion and on the side of an inner peripheral portion is 1:1.1 to 2.

8. The carbon wire heating element sealing heater according to claim 7, wherein the heater top holding member is welded to the inside of a circular quartz glass pipe formed on the top while the heater bottom holding member is welded to the outside of the circular quartz glass pipe formed on the bottom.

9. The carbon wire heating element sealing heater according to claim 8, wherein a bottom face of the heater bottom holding member is located above the bottom face of the sealing terminal portion.

10. A carbon wire heating element sealing heater in which a carbon wire heating element using carbon fibers is sealed in a quartz glass member, wherein the quantity of water absorbed in the carbon wire heating element is $2 \times 10^{-3}$ g or less per 1 cm$^3$ of said carbon wire heating element, the carbon wire heating element sealing heater further comprising:

a heater portion made of quartz glass pipe for accommodating a carbon wire heating element composed of carbon fibers, sealing terminal portions provided on both ends of the quartz glass pipe of the heater portion and a connecting terminal provided on the sealing terminal portion, wherein the heater portion is formed by winding the quartz glass pipe spirally vertically while the quartz glass pipe extending vertically is formed linearly and the quartz glass pipes on the top and bottom portions are formed circularly, and the sealing terminal portions are formed at end portions of the quartz glass pipes of the heater portion extended to sides of the same faces, the sealing terminal portion including a glass pipe for accommodating an end portion of the carbon wire heating element and wire carbon member accommodated in the glass pipe in a compressed state and for nipping an end portion of the carbon wire heating element, the wire carbon member being constituted of plural wire carbon bundles each composed of wire carbon materials, the carbon wire heating element being disposed among the plural wire carbon bundles and substantially in the center of the glass pipe.

11. A fluid heating apparatus comprising:

a heating pipe for heating fluid supplied from a fluid supply source, a heater portion formed around the heating pipe and made of quartz glass pipe for accommodating a carbon wire heating element composed of carbon fibers and a housing for accommodating the heating pipe and the heater portion, wherein filler material resisting passing fluid is disposed inside the heating pipe while a diffusion plate is formed integrally with an upstream side face of the filler material;

wherein the carbon wire heating element using carbon fibers is sealed in a quartz glass member, and wherein the quantity of water absorbed in the carbon wire heating element is $2 \times 10^{-3}$ g or less per 1 $cm^3$ of said carbon wire heating element.

12. The fluid heating apparatus according to claim 11, wherein the filler material is short-column like quartz glass bead, the diffusion plate is a quartz glass plate while the diffusion plate is fused with at least one face of the filler material formed by fusing the quartz beads together.

13. A carbon wire beating element sealing heater according to claim 12, wherein the quantity of the wire carbon members accommodated in the second glass pipe is larger than that of the wire carbon members accommodated in the first glass pipe.

14. The carbon wire heating element sealing heater according to claim 12, wherein the wire carbon bundles are accommodated in the glass pipe such that folded-back portions of the wire carbon bundles are located on an introduction side of the carbon wire heating element in the glass pipe for accommodating the end portion of the carbon wire heating element.

15. A fluid heating apparatus comprising:

a heating pipe for heating fluid supplied from a fluid supply source, a heater portion formed around the heating pipe and made of quartz glass pipe for accommodating a carbon wire heating element composed of carbon fibers and a housing for accommodating the heating pipe and the heater portion, wherein filler material resisting passing fluid is disposed inside the heating pipe while a diffusion plate is formed integrally with an upstream side face of the filler material, the fluid heating apparatus comprising:

a glass pipe for accommodating an end portion of the carbon wire heating element at an end portion of the heater portion; wire carbon member accommodated in the glass pipe in a compressed state and for nipping an end portion of the carbon wire heating element and a terminal portion accommodated in an end portion of the glass pipe and having a power supply connecting wire nipped by the compressed wire carbon member, the wire carbon member being constituted of plural wire carbon bundles each composed of wire carbon materials, the carbon wire heating element being disposed among the plural wire carbon bundles and substantially in the center of the glass pipe;

wherein the carbon wire heating element using carbon fibers is sealed in a quartz glass member, and wherein the quantity of water absorbed in the carbon wire heating element is $2 \times 10^{-3}$ g or less per 1 $cm^3$ of said carbon wire heating element.

16. The carbon wire heating element sealing heater according to claim 15, wherein the wire carbon bundles are accommodated in the glass pipe such that folded-back portions of the wire carbon bundles are located on an introduction side of the carbon wire heating element in the glass pipe for accommodating the end portion of the carbon wire heating element.

17. A carbon wire heating element sealing heater in which a carbon wire heating element using carbon fibers is sealed in a quartz glass member, comprising:

a glass pipe disposed at an end portion of the quartz glass member and for accommodating the end portion of the carbon wire heating element;

a wire carbon member for nipping an end portion of the carbon wire heating element; and a terminal portion whose end is accommodated in the glass pipe and which contains a connecting wire for power supply nipped by compressed wire carbon members, wherein the wire carbon member is constituted of plural wire carbon bundles composed of wire carbon materials, the carbon wire heating element is disposed substantially in the center of the glass pipe among the plural wire carbon bundles, a glass pipe for accommodating the carbon wire heating element is formed in a T shape while an end thereof is sealed, and the carbon wire heating element and the carbon wire bundles are disposed substantially in parallel to the axes from an opening end portion of the glass pipe to a sealing end portion thereof, and the carbon wire heating element is introduced from among the wire carbon bundles at a bent portion of the glass pipe.

18. A carbon wire heating element sealing heater in which a carbon wire heating element using carbon fibers is sealed in a quartz glass member, comprising:

a heater portion made of quartz glass pipe for accommodating a carbon wire heating element composed of carbon fibers, sealing terminal portions provided on both ends of the quartz glass pipe of the heater portion and a connecting terminal provided on the sealing terminal portion, wherein the heater portion is formed by winding the quartz glass pipe spirally vertically while the quartz glass pipe extending vertically is formed linearly and the quartz glass pipes on the top and bottom portions are formed circularly, and the sealing terminal portions are formed at end portions of the quartz glass pipes of the heater portion extended to sides of the same faces, the sealing terminal portion including a glass pipe for accommodating an end portion of the carbon wire heating element and wire carbon member accommodated in the glass pipe in a compressed state and for nipping an end portion of the carbon wire heating element, the wire carbon member being constituted of plural wire carbon bundles each composed of wire carbon materials, the carbon wire heating element being disposed among the plural wire carbon bundles and substantially in the center of the glass pipe.

19. The carbon wire heating element sealing heater according to claim 18, wherein the curvature radius of the quartz glass pipe formed circularly is twice or more to five times or less the outside diameter of the quartz glass pipe.

20. The carbon wire heating element sealing heater according to claim 19, wherein the ratio between the thickness of the heater portion formed circularly of the quartz glass on the side of an outer peripheral portion and on the side of an inner peripheral portion is 1:1.1 to 2.

21. The carbon wire heating element sealing heater according to claim 20, wherein the heater top holding member is welded to the inside of a circular quartz glass pipe formed on the top while the heater bottom holding member is welded to the outside of the circular quartz glass pipe formed on the bottom.

22. The carbon wire heating element sealing heater according to claim 21, wherein a bottom face of the heater bottom holding member is located above the bottom face of the sealing terminal portion.

23. A fluid heating apparatus comprising:

a heating pipe for heating fluid supplied from a fluid supply source, a heater portion formed around the heating pipe and made of quartz glass pipe for accommodating the carbon wire heating element composed of carbon fibers and a housing for accommodating the heating pipe and the heater portion, wherein filler material resisting passing fluid is disposed inside the heating pipe while a diffusion plate is formed integrally with an upstream side face of the filler material.

24. A fluid heating apparatus comprising:

a heating pipe for heating fluid supplied from a fluid supply source, a heater portion formed around the heating pipe and made of quartz glass pipe for accommodating the carbon wire heating element composed of carbon fibers and a housing for accommodating the heating pipe and the heater portion, wherein filler material resisting passing fluid is disposed inside the heating pipe while a diffusion plate is formed integrally with an upstream side face of the filler material, the fluid heating apparatus comprising:

a glass pipe for accommodating an end portion of the carbon wire heating element at an end portion of the heater portion: wire carbon member accommodated in the glass pipe in a compressed state and for nipping an end portion of the carbon wire heating element and a terminal portion accommodated in an end portion of the glass pipe and having a power supply connecting wire nipped by the compressed wire carbon member, the wire carbon member being constituted of plural wire carbon bundles each composed of wire carbon materials, the carbon wire heating element being disposed among the plural wire carbon bundles and substantially in the center of the glass pipe.

25. The fluid heating apparatus according to claim 24, wherein the filler material is short-column like quartz glass bead, the diffusion plate is a quartz glass plate while the diffusion plate is fused with at least one face of the filler material formed by fusing the quartz beads together.

26. The fluid heating apparatus according to claim 25, wherein the diffusion plate is composed of a disc-like quartz glass plate containing plural through holes and the ratio of openings per unit area by the through holes is larger on an outer peripheral portion than in the portion.

27. The fluid heating apparatus according to claim 26, wherein the porosity on a downstream side of the filler material formed by fusing the short-column like quartz glass beads is smaller on the porosity on the upstream side.

* * * * *